(12) United States Patent
Ong et al.

(10) Patent No.: US 10,454,033 B2
(45) Date of Patent: Oct. 22, 2019

(54) SOLUTION PROCESS FOR FABRICATING HIGH-PERFORMANCE ORGANIC THIN-FILM TRANSISTORS

(71) Applicant: Hong Kong Baptist University, Hong Kong (HK)

(72) Inventors: Beng Soon Ong, Hong Kong (HK); Yanlian Lei, Hong Kong (HK)

(73) Assignee: HONG KONG BAPTIST UNIVERSITY, Hong Kong (HK)

( * ) Notice: Subject to any disclaimer, the term of this patent is extended or adjusted under 35 U.S.C. 154(b) by 340 days.

(21) Appl. No.: 15/464,336

(22) Filed: Mar. 20, 2017

(65) Prior Publication Data

US 2017/0200896 A1 Jul. 13, 2017

Related U.S. Application Data

(62) Division of application No. 15/401,035, filed on Jan. 8, 2017, now Pat. No. 10,164,192.

(Continued)

(51) Int. Cl.
*H01L 51/00* (2006.01)
*C09D 11/52* (2014.01)
(Continued)

(52) U.S. Cl.
CPC ............ *H01L 51/0036* (2013.01); *B32B 3/10* (2013.01); *C08G 61/126* (2013.01); *C09D 5/24* (2013.01);
(Continued)

(58) Field of Classification Search
CPC ............ H01L 51/0003; H01L 51/0004; H01L 51/0558; Y10T 428/24802
See application file for complete search history.

(56) References Cited

U.S. PATENT DOCUMENTS 8,518,738 B2 * 8/2013 Sirringhaus ......... H01L 51/0012
438/99

OTHER PUBLICATIONS

Lim et al., "Inkjet-Printed Single-Droplet Organic Transistors based on semiconductor nanowires embedded in insulating polymers" Adv. Funct. Mater. 2010, vol. 20, p. 3292-3297.*

(Continued)

*Primary Examiner* — Gerard Higgins
(74) *Attorney, Agent, or Firm* — Idea Intellectual Limited; Margaret A. Burke; Sam T. Yip

(57) ABSTRACT

The present invention relates to a solution or ink composition for fabricating high-performance thin-film transistors. The solution or ink comprises an organic semiconductor and a mediating polymer such as polyacrylonitrile, polystyrene, or the like or mixture thereof, in an organic solvent such as chlorobenzene or dichlorobenzene. The percentage ratio by weight of semiconductor:mediating polymer ranges from 5:95 to 95:5, and preferably from 20:80 to 80:20. The solution or ink is used to fabricate via solution coating or printing a semiconductor film, followed by drying and thermal annealing if necessary to provide a channel semiconductor for organic thin-film transistors (OTFTs). The resulting OTFT device with said channel semiconductor has afforded OTFT performance, particularly field-effect mobility and current on/off ratio that are superior to those OTFTs with channel semiconductors fabricated without a mediating polymer.

16 Claims, 11 Drawing Sheets

Related U.S. Application Data

(60) Provisional application No. 62/276,321, filed on Jan. 8, 2016.

(51) Int. Cl.

| | | |
|---|---|---|
| *C09D 11/106* | (2014.01) | |
| *C09D 11/107* | (2014.01) | |
| *H01L 51/05* | (2006.01) | |
| *B32B 3/10* | (2006.01) | |
| *C09D 11/12* | (2006.01) | |
| *C08G 61/12* | (2006.01) | |
| *C09D 7/65* | (2018.01) | |
| *C09D 5/24* | (2006.01) | |
| *C09D 11/108* | (2014.01) | |
| *C09D 123/06* | (2006.01) | |
| *C09D 125/06* | (2006.01) | |
| *C09D 127/06* | (2006.01) | |
| *C09D 133/12* | (2006.01) | |
| *C09D 165/00* | (2006.01) | |
| *C09D 133/20* | (2006.01) | |

(52) U.S. Cl.
CPC .............. *C09D 7/65* (2018.01); *C09D 11/106* (2013.01); *C09D 11/107* (2013.01); *C09D 11/108* (2013.01); *C09D 11/12* (2013.01); *C09D 11/52* (2013.01); *C09D 123/06* (2013.01); *C09D 125/06* (2013.01); *C09D 127/06* (2013.01); *C09D 133/12* (2013.01); *C09D 165/00* (2013.01); *H01L 51/0003* (2013.01); *H01L 51/004* (2013.01); *H01L 51/0035* (2013.01); *H01L 51/0043* (2013.01); *H01L 51/0558* (2013.01); *H01L 51/0566* (2013.01); *C08G 2261/124* (2013.01); *C08G 2261/1412* (2013.01); *C08G 2261/212* (2013.01); *C08G 2261/3223* (2013.01); *C08G 2261/3243* (2013.01); *C08G 2261/334* (2013.01); *C08G 2261/344* (2013.01); *C08G 2261/364* (2013.01); *C08G 2261/51* (2013.01); *C08G 2261/92* (2013.01); *C09D 133/20* (2013.01); *H01L 51/0004* (2013.01); *H01L 51/0026* (2013.01); *H01L 51/0053* (2013.01); *H01L 51/0533* (2013.01); *H01L 51/0541* (2013.01); *H01L 51/0545* (2013.01); *Y10T 428/24802* (2015.01)

(56) References Cited

OTHER PUBLICATIONS

Supplemental Information for Nat. Commun. 5:3005, p. 1-9 acquired from https://media.nature.com/original/nature-assets/ncomms/2014/140108/ncomms4005/extref/ncomms4005-s1.pdf (Year: 2014).*

Yuan et al. "Ultra-high mobility transparent organic thin film transistors grown by an off-centre spin-coating method" Nat. Commun. 5:3005, p. 1-9. (Year: 2014).*

* cited by examiner

SOLUTION PROCESS FOR FABRICATING HIGH-PERFORMANCE ORGANIC THIN-FILM TRANSISTORS

CROSS-REFERENCE TO RELATED APPLICATIONS

This application is a divisional application of U.S. Nonprovisional patent application Ser. No. 15/401,035 filed on Jan. 8, 2017, the disclosure of which is hereby incorporated by reference; and which claims priority from and the benefit of U.S. Provisional Patent Application Ser. No. 62/276,321 filed on Jan. 8, 2016, the disclosure of which is hereby incorporated by reference.

FIELD OF THE INVENTION

The present invention relates to a solution or ink composition for fabricating high-performance thin-film transistors. The solution or ink comprises an organic semiconductor and a mediating polymer such as polyacrylonitrile, polystyrene, or the like or mixture thereof, in an organic solvent such as chlorobenzene or dichlorobenzene. The percentage ratio by weight of semiconductor:mediating polymer ranges from 5:95 to 95:5, and preferably from 20:80 to 80:20. The solution or ink is used to fabricate via solution coating or printing a semiconductor film, followed by drying and thermal annealing if necessary to provide a channel semiconductor for organic thin-film transistors (OTFTs). The resulting OTFT device with said channel semiconductor has afforded OTFT performance, particularly field-effect mobility and current on/off ratio that are superior to those OTFTs with channel semiconductors fabricated without a mediating polymer. In particular, devices made according to the present invention have a field-effect mobility of greater than or equal to 2 $cm^2V^{-1}s^{-1}$ and a current on/off ratio greater than or equal to $10^5$, while in some embodiments, field-effect mobility of greater than or equal to 5 $cm^2V^{-1}s^{-1}$ and a current on/off ratio greater than or equal to $10^6$ have been obtained.

BACKGROUND OF THE INVENTION

Printed electronics represents a new generation of large-area, flexible, ultra-low-cost, and disposable electronics such as backplane electronics for flat-panel displays, biosensors and imagers, radio frequency identification tags, smart labels and packaging, to name a few. To enable substantially lowered manufacturing costs, the electronic arrays and circuitries for printed electronics are to be produced by low-cost manufacturing processes such as, for example, printing using graphic arts printing techniques instead of conventional costly photolithographic processes. Specifically, printing electronic arrays and circuitries in a roll-to-roll manner will greatly increase throughput and thus significantly reduce manufacturing costs owing to reduced process steps and economies of scale of production. Low-cost electronic arrays and circuitries can also be cost-effectively printed in large formats, thus making large-area electronic devices economical. In addition, printed electronics can be fabricated on flexible plastic substrates, rendering the resulting electronic devices structurally flexible and bendable as well as being mechanically robust.

The building blocks for printed electronic arrays and circuitries are organic thin-film transistors (OTFTs) whose channel semiconductors are based on organic semiconductors. For most high-value electronic applications (e.g., in flat-panel displays, RFID, etc.), the field-effect mobility and current on/off ratio of OTFTs of respectively at least about 2 $cm^2V^{-1}s^{-1}$ and $10^5$ and beyond would be highly desirable. Certain small molecular organic fused-ring aromatic compounds and organic conjugated polymers, particularly those with alternating electron donor and electron acceptor moieties on their backbones, have captured immense interest as semiconductors of choice for OTFTs as they have exhibited reasonably high field-effect mobility and current on/off ratio that appear to meet application requirements. Notwithstanding these remarkable achievements in materials performance, progress towards OTFT technology transition from laboratory to marketplace has lagged behind. One of the major stumbling blocks to practical adoption has been the complications associated with the solution processing of organic semiconductors. For organic small molecular fused-ring aromatic semiconductors, the properties of the resulting channel semiconductor films formed from these compounds via solution fabrication are particularly sensitive to the nature and manner of semiconductor deposition. This is because the crystallinity, which affects the field-effect properties of deposited semiconductor films, is dependent on the rate of solvent evaporation. Generally, slow evaporation leads to higher crystallinity in the semiconductor films and thus better OTFT performance characteristics, while fast evaporation yields poor and non-uniform semiconductor films of low crystallinity and poor OTFT properties. Accordingly, great variations in OTFT properties result when small molecular semiconductors are processed by solution deposition. For polymer semiconductors, the solution or ink preparation for coating or printing channel semiconductor layers requires the polymer semiconductor to have a good solubility in the processing solvent. Unfortunately, most high-mobility polymer semiconductors for OTFTs are polar polymers with relatively high molecular weights, and thus limited solubility in common processing solvents. While these polymers may be dissolved in the processing solvents with heating, their solutions tend to gel or exhibit solid precipitation or inhomogeneity when the solutions are cooled down to room temperature. This has caused severe complications in fabricating or printing the channel semiconductors for OTFTs. The use of lower-molecular weight polymer semiconductor materials, which possess reasonably good solubility in processing solvents, affords low mobility. This is because the charge transport efficacy of polymer semiconductors degrades rapidly with decreasing molecular weight. High molecular weights appear to facilitate molecular self-assembly of polymer semiconductors, leading to higher crystalline orders which are crucial to charge carrier transport efficiency and thus field-effect mobility of OTFTs.

One of the possible approaches to circumventing the afore-mentioned fabrication complications for both small molecular and polymer semiconductors is to utilize a polymer to mediate molecular self-assembly of semiconductors. This method permits utilization of a lower concentration of semiconductor in the fabrication solution, thus yielding a more stable solution. The polymer-in-solution affords a fluid medium for the semiconductor molecules to move around and self-assemble to higher degrees of molecular ordering. Through this polymer-mediated molecular self-assembly, the dissolved small molecular or polymer semiconductors including low-molecular weight polymer semiconductors, may be processed into semiconductor films of higher molecular orders, affording significantly enhanced charge transport efficacy, and thus superior OTFT properties.

A prior-art example for the attainment of highly aligned crystalline films from small molecular semiconductor in a polystyrene blend has been reported in "*Ultra-high mobility* transparent organic thin film transistors grown by an off-centre spin-coating method", Nature Communications, Vol 5:3005 (2014) DOI: 10.1038/ncomms4005 |www.nature.com/naturecommunications, the disclosure of which is hereby incorporated by reference. In this process, the small molecular semiconductor and polystyrene are dissolved in a solvent and fabricated into a polystyrene-semiconductor dual-layer film using an off-center spin-coating technique. The small semiconductor molecules phase separate from the polystyrene in a vertical manner and the centrifugal force exerted on the semiconductor in the off-center position forces the small semiconductor molecules to align into a highly crystalline film. Another prior art example involves a polymer material such as regioregular poly(3-hexythiophene) as described in "*Organic Thin-film Transistors Based on Polythiophene Nanowires Embedded in Insulating Polymer*", Advanced Materials, Vol. 21, pp. 1349-1353 (2009), the disclosure of which is hereby incorporated by reference. Crystalline nanowires with improved charge transport properties have been grown from this polymer semiconductor at very low loadings in polystyrene blends with the help of a marginal solvent such as methylene chloride. Similarly, high-mobility, single-crystal nanowires of a polymer semiconductor has been produced from its dilute solution in a marginal solvent, see for example, "*High Aspect Ratio Conjugated Polymer Nanowires for High Performance Field-Effect Transistors and Phototransistors*", American Chemical Society Nano, Vol. 9, pp. 5264-5274 (2015), the disclosure of which is hereby incorporated by reference. However, all these prior-art solution procedures for achieving high molecular orders to enhance charge transport properties are not amenable to conventional coating or printing processes, thus rendering their use in fabricating low-cost OTFTs for practical applications impractical. Achievement of high molecular orders for organic semiconductors via scalable solution processes to produce low-cost OTFTs with enhanced charge transport properties has not been reported.

Accordingly, it is an objective of the present invention to provide a solution or ink composition which permits fabrication of a channel semiconductor via scalable solution processes to enable OTFTs with enhanced transistor performance properties.

Another objective of the present invention is the provision of a scalable solution process for fabricating a channel semiconductor for high-performance OTFTs which are suitable for low-cost electronic applications.

A further objective of the present invention is to provide a stable solution or ink composition comprising a semiconductor and a mediating polymer or polymers in a suitable solvent, wherein said solution or ink can be utilized in the fabrication of a channel semiconductor via high-throughput processes for high-performance OTFTs.

SUMMARY OF THE INVENTION

The present invention relates to a solution or ink composition for fabricating high-performance thin-film transistors. The solution or ink comprises an organic semiconductor and a mediating polymer such as polyacrylonitrile, polystyrene, or the like or mixture thereof in an organic solvent such as chlorobenzene or dichlorobenzene. The percentage ratio by weight of semiconductor:mediating polymer ranges from 5:95 to 95:5, and preferably from 20:80 to 80:20. The solution or ink is used to fabricate via solution coating or printing a semiconductor film, followed by drying and thermal annealing if necessary to provide a channel semiconductor for OTFTs. The resulting OTFT device with said channel semiconductor has superior OTFT performance, particularly field-effect mobility and current on/off ratio compared to those OTFTs with channel semiconductors fabricated without a mediating polymer.

In a first aspect of the present invention these is provided a solution-based method of fabricating channel semiconductor for organic thin-film transistors (OTFTs) comprising dissolving an organic semiconductor in a solvent with a mediating polymer at a percentage ratio by weight of semiconductor:mediating polymer ranging from 5:95 to 95:5, to produce a solution; spin casting or printing said solution on a substrate to produce a channel semiconductor, and wherein the resulting OTFT with said channel semiconductor exhibits a field effect mobility of greater than or equal to 2 $cm^2V^{-1}s^{-1}$ and a current on/off ratio of greater than or equal to $10^5$.

In a first embodiment of the first aspect of the present invention there is provided a solution-based method of fabricating channel semiconductor for organic thin-film transistors wherein the percentage ratio by weight of semiconductor:mediating polymer ranges from 20:80 to 80:20.

In a second embodiment of the first aspect of the present invention there is provided a solution-based method of fabricating channel semiconductor for organic thin-film transistors wherein the resulting OTFT device with said channel semiconductor has a field effect mobility of greater than or equal to 5 $cm^2V^{-1}s^{-1}$ and a current on/off ratio of greater than or equal to $10^6$.

In a third embodiment of the first aspect of the present invention there is provided a solution-based method of fabricating channel semiconductor for organic thin-film transistors wherein the resulting OTFT thin-film transistor with said channel semiconductor has a field effect mobility of greater than or equal to 8 $cm^2V^{-1}s^{-1}$ and a current on/off ratio of greater than or equal to $10^6$.

In a fourth embodiment of the first aspect of the present invention there is provided a solution-based method of fabricating channel semiconductor for organic thin-film transistors wherein the percentage ratio by weight of semiconductor:mediating polymer ranging from 30:70 to 70:30.

In a fifth embodiment of the first aspect of the present invention there is provided a solution-based method of fabricating channel semiconductor for organic thin-film transistors wherein the mediating polymer comprises polyacrylonitrile, polystyrene, poly(methyl methacrylate), poly(methyl methacrylate-alt-styrene), polyvinyl chloride, or mixtures thereof.

In a sixth embodiment of the first aspect of the present invention there is provided a solution-based method of fabricating channel semiconductor for organic thin-film transistors wherein the semiconductor comprises a polymer semiconductor including a diketopyrrolopyrrole-based polymer or regioregular poly(3-hexylthiophene), or a mixture thereof.

In a seventh embodiment of the first aspect of the present invention there is provided a solution-based method of fabricating channel semiconductor for organic thin-film transistors wherein the semiconductor comprises a polymer represented by the following formula:

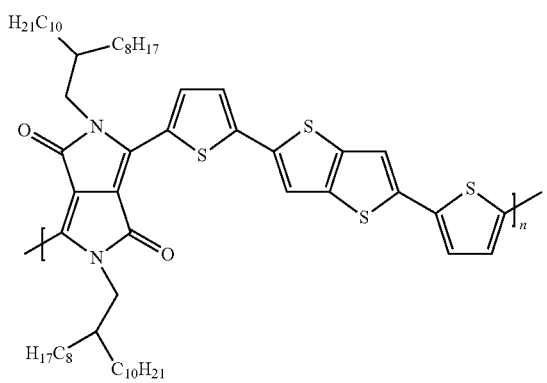

or

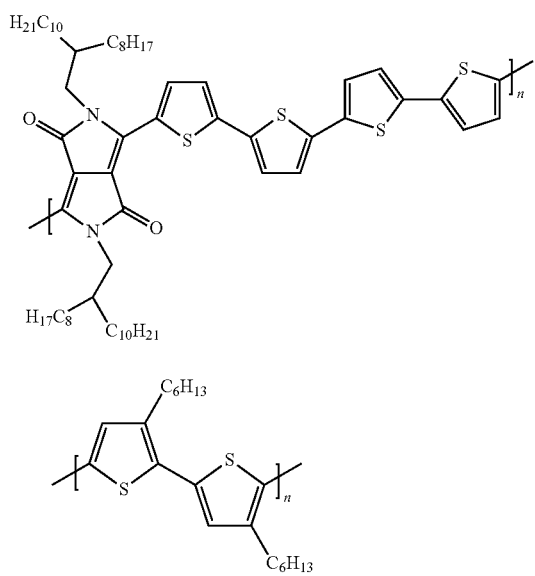

or

In an eighth embodiment of the first aspect of the present invention there is provided a solution-based method of fabricating channel semiconductor for organic thin-film transistors wherein the semiconductor comprises one or more organic small molecular compound.

In a ninth embodiment of the first aspect of the present invention there is provided a solution-based method of fabricating channel semiconductor for organic thin-film transistors further comprising drying with thermal annealing after spin casting or printing of solution on a substrate.

In a tenth embodiment of the first aspect of the present invention there is provided a solution-based method of fabricating channel semiconductor for organic thin-film transistors wherein the substrate comprises a metalized plastic substrate coated with a thin layer of metal oxide.

In an eleventh embodiment of the first aspect of the present invention there is provided a solution-based method of fabricating channel semiconductor for organic thin-film transistors wherein the metal oxide is aluminum oxide or hafnium oxide.

In a second aspect of the present invention these is provided an organic thin film transistor device having an organic semiconductor-based channel, the OTFT device comprising: a channel comprising an organic semiconductor crystallized within a mediating polymer in the OTFT device on a substrate, the mediating polymer selected from poly-acrylonitrile, polystyrene, poly(methyl methacrylate), poly(methyl methacrylate-alt-styrene), polyvinyl chloride, or a mixture thereof at a percentage ratio by weight of semiconductor:mediating polymer ranging from 5:95 to 95:5, and wherein the OTFT device has a field effect mobility of greater than or equal to 2 $cm^2V^{-1}s^{-1}$ and a current on/off ratio of greater than or equal to $10^5$.

In a first embodiment of the second aspect of the present invention these is provided an organic thin film transistor device having an organic semiconductor-based channel wherein the semiconductor is selected from a diketopyrrolopyrrole-based polymer or regioregular poly(3-hexylthiophene), or a mixture thereof.

In a second embodiment of the second aspect of the present invention these is provided an organic thin film transistor device having an organic semiconductor-based channel wherein the semiconductor comprises a polymer represented by the following formula:

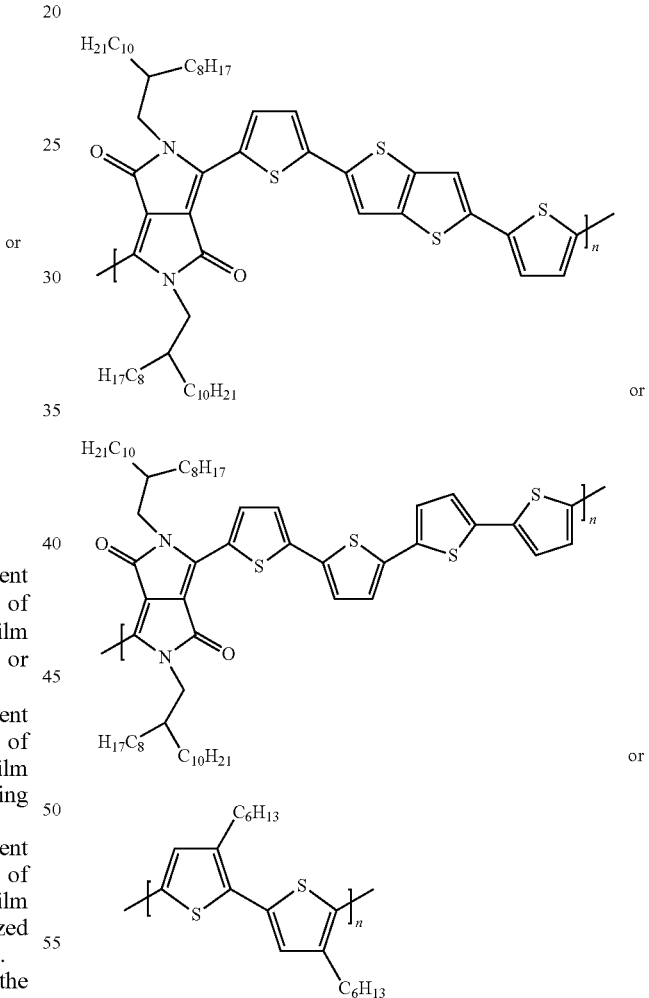

In a third embodiment of the second aspect of the present invention these is provided an organic thin film transistor device having an organic semiconductor-based channel wherein the substrate comprises a metalized plastic coated with a thin layer of metal oxide.

In a forth embodiment of the second aspect of the present invention there is provided an organic thin film transistor (OTFT) device having an organic semiconductor-based channel comprises said channel semiconductor of an organic semiconductor crystallized in the mediating polymer has a field effect mobility of greater than or equal to 5 $cm^2V^{-1}s^{-1}$ and a current on/off ratio of greater than or equal to $10^6$.

In a fifth embodiment of the second aspect of the present invention these is provided an organic thin film transistor device having an organic semiconductor-based channel comprises said channel semiconductor of an organic semiconductor crystallized in the mediating polymer has a field effect mobility of greater than or equal to 8 $cm^2V^{-1}s^{-1}$ and a current on/off ratio of greater than or equal to $10^6$.

In a sixth embodiment of the second aspect of the present invention these is provided an organic thin film transistor device having an organic semiconductor-based channel wherein the percentage ratio by weight of semiconductor:mediating polymer ranges from 20:80 to 80:20.

Those skilled in the art will appreciate that the invention described herein is susceptible to variations and modifications other than those specifically described.

The invention includes all such variation and modifications. The invention also includes all of the steps and features referred to or indicated in the specification, individually or collectively, and any and all combinations or any two or more of the steps or features.

Other aspects and advantages of the invention will be apparent to those skilled in the art from a review of the ensuing description.

BRIEF DESCRIPTION OF THE DRAWINGS

The above and other objects and features of the present invention will become apparent from the following description of the invention, when taken in conjunction with the accompanying drawings, in which.

DETAILED DESCRIPTION

The present invention is not to be limited in scope by any of the specific embodiments described herein. The following embodiments are presented for exemplification only.

Without wishing to be bound by theory, the present invention fabricates a channel semiconductor of high molecular orders or crystallinity for OTFTs via scalable solution processes to enable low-cost OTFTs with enhanced charge transport properties.

Figure 1:
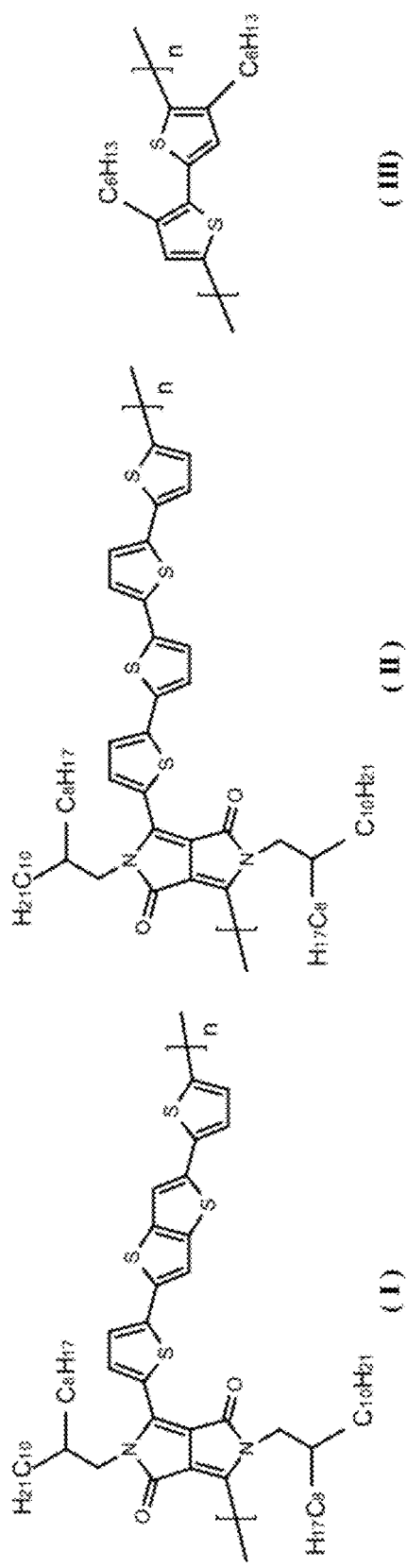
FIG. 1 shows the chemical structures of illustrative semiconductors used in the present invention.
Figure 5:
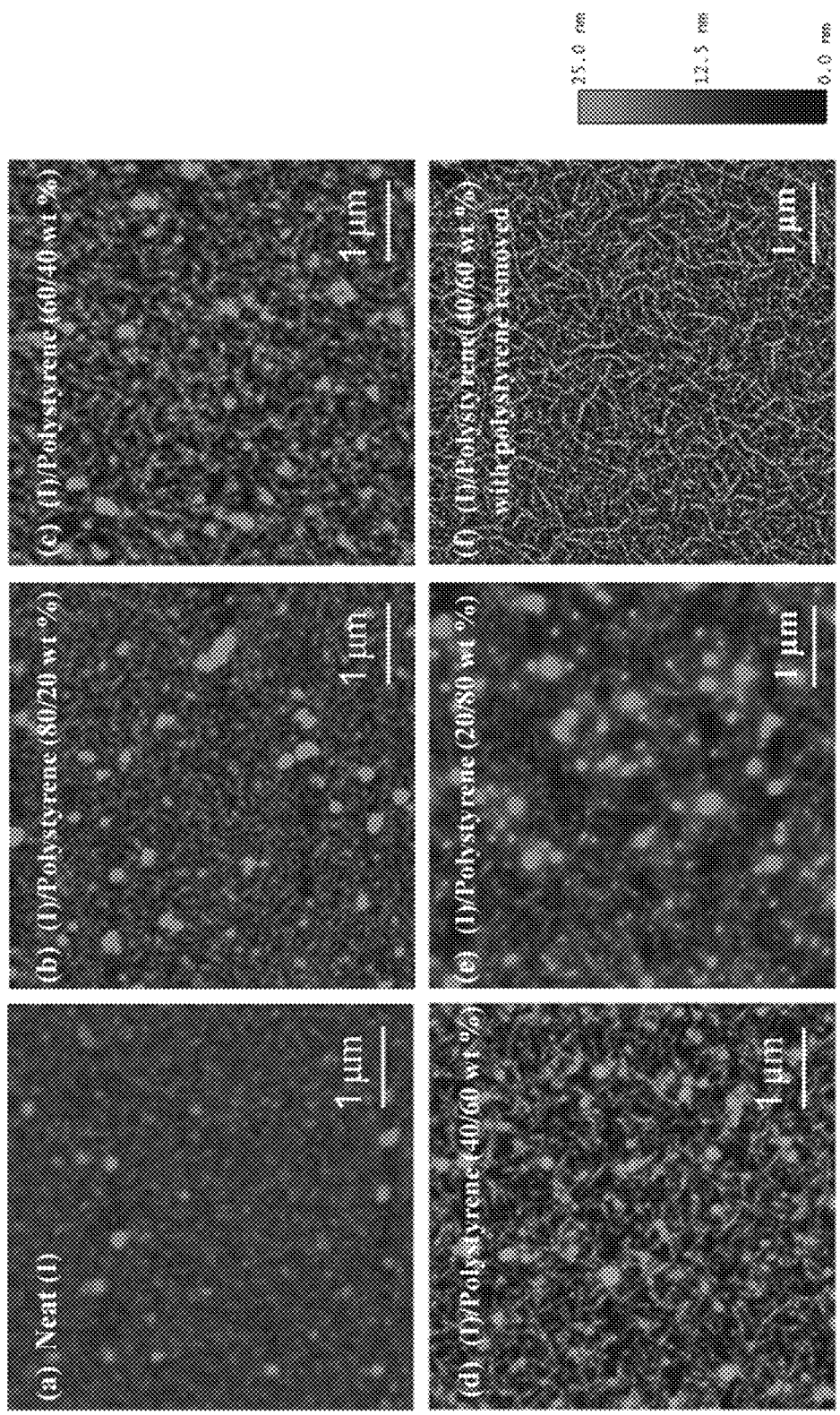
FIG. 5 shows the atomic force microscopic (AFM) topographic images of thermally annealed films of polymer semiconductor (I) with and without polystyrene; (a) film of neat (I) displaying grainy nanodomain features; (b) (I)/polystyrene (80/20 wt %) film showing signs of aggregation of nanograins into nanowire-like structures; (c) formation of nanowire network in (I)/polystyrene (60/40 wt %) film; (d) optimal nanowire network formation in (I)/polystyrene (40/60 wt %) film; (e) degradation of nanowire domains in (I)/polystyrene (20/80 wt %) film; (f) well-defined nanowire network of thermally annealed (I)/polystyrene (40/60 wt %) film with the polystyrene removed.
Figure 6:
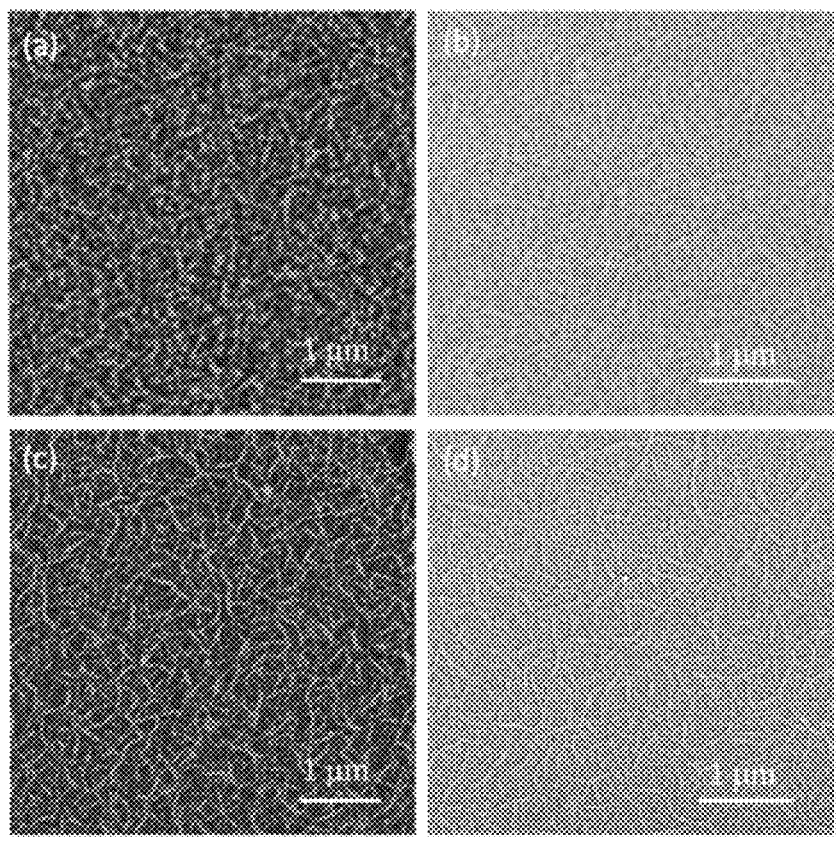
FIG. 6 shows the atomic force microscopic (AFM) and scanning electron microscopic (SEM) images of nanowire networks of polymer semiconductor (I) from (I)/polystyrene (40/60 wt %) films. (a) and (b) are AFM (topography) and SEM images of defused nanowire-like features of (I) from (I)/polystyrene film thermally annealed after polystyrene removal; (c) and (d) are AFM and SEM images of well-defined nanowire network of (I) from thermally annealed (I)/polystyrene film with the polystyrene removed after thermal treatment.

The invention relates to a novel scalable solution process of polymer-mediated molecular self-assembly of organic semiconductors into highly ordered semiconductor films for use as the channel semiconductors in high-performance OTFTs. The working examples demonstrate the present invention using several different polymer semiconductors including diketopyrrolopyrrole-based polymers (I) and (II), and regioregular poly(3-hexylthiophene) (III), the structures of which are depicted in FIG. 1. For example, polymer semiconductor (I), when fabricated into a channel semiconductor for OTFTs from its solution in dichlorobenzene without a mediating polymer according to past reports, has afforded a field-effect mobility of about 1.5 $cm^2V^{-1}s^{-1}$ and current on/off ratio of $10^5$. In one embodiment of the present invention, it is demonstrated that this same polymer semiconductor (I) can be solution fabricated into highly crystalline channel semiconductor films when a mediating polymer such as polystyrene is incorporated into the semiconductor solution or ink, offering significantly higher field-effect mobility of greater than or equal to 2 $cm^2V^{-1}s^{-1}$ and a current on/off ratio of greater than or equal to $10^5$ in OTFT devices. In some aspects, the field effect mobility is greater than or equal to 5 $cm^2V^{-1}s^{-1}$ and a current on/off ratio of greater than or equal to $10^6$. In other aspects, the field effect mobility is greater than or equal to 8 $cm^2V^{-1}s^{-1}$ and a current on/off ratio of greater than or equal to $10^7$ in OTFT devices. Higher molecular ordering or crystallinity of (I) in the prepared channel semiconductor films can be deduced from the spectral absorptions of the thin films as presented in FIG. 4. The spectra show distinctive vibronic splitting which are characteristics of intermolecular ordering. In addition, the intensity of 0-0 vibrational peak of said vibronic splitting is significantly enhanced as compared to that of semiconductor thin films fabricated without polystyrene. Higher crystallinity of polymer (I) in the form of nanowire network can also be observed in the AFM and SEM images, showing well-defined nanowire networks of polymer (I) in the (I)/polystyrene films (FIG. 5 and FIG. 6).

In another embodiment of the present invention, an organic semiconductor can be solution fabricated or printed into a channel semiconductor of high crystallinity to give high field-effect mobility and current on/off ratio in OTFTs. Typically, the process involves dissolution of an organic semiconductor in a solvent such as chlorobenzene or dichlorobenzene with a suitable mediating polymer such as polyacrylonitrile at an appropriate percentage ratio by weight of semiconductor:mediating polymer ranging from about 5:95 to 95:5. Preferably, the semiconductor:mediating polymer percentage ratio by weight ranges from 20:80 to 80:20. Specifically, an organic semiconductor such as (I), (II), or (III) of FIG. 1, or the like and a mediating polymer such as polyacrylonitrile at an appropriate percentage ratio by weight are dissolved in a suitable processing solvent such as chlorobenzene or dichlorobenzene with optional heating if necessary. The solution is optionally filtered through a syringe filter and then spin cast or printed onto a suitable substrate to form a thin film. The substrate materials are preferably those whose surfaces carry alkyl chains and the like which can help induce and promote molecular ordering of the semiconductor molecules. As an illustrative example, a heavily n-doped silicon wafer with a surface silicon dioxide layer (Si/$SiO_2$) is first subjected to oxygen plasma or UV/ozone treatment, and then chemically modified with a silylating agent such as alkyltrichlorosilane, alkyltrimethoxysilane, or alkyltriethoxysilane including for example octyltrichlorosialne or octadecyltrichlorosilane in accordance to the published surface modification procedures as reported in "*Engineering gate dielectric surface properties for enhanced polymer field-effect transistor Performance*", Journal of materials Chemistry C, Vol. 3, pp. 12267-12272 (2015), the disclosure of which is hereby incorporated by reference.

Alternatively, a metalized plastic substrate coated with a thin layer of aluminum oxide, hafnium oxide, or the like, which has been oxygen plasma or UV/ozone treated, and subsequently modified with a silylating agent can also be utilized. The semiconductor solution is spin coated or printed onto the afore-mentioned substrate to form a semiconductor film after drying with optional thermal annealing at elevated temperatures. Facile molecular self-assembly of semiconductor molecules and in some embodiments, their eventual crystallization within the mediating polymer matrix occurs at room temperature. The extent of molecular ordering of the semiconductor increases with the mediating polymer concentration of up to about 70% to 80% by weight, and the process is greatly expedited by thermal treatment. Other polymers such as polystyrene, poly(methyl methacrylate), polyvinyl chloride, and the like or mixtures thereof may also be utilized as the mediating polymer to facilitate molecular self-assembly of polymer semiconductors in varying degrees of efficiency, thus the performance of the resulting OTFT devices.

In yet another aspect of the present invention there is provided a solution process which transforms a lower-mobility semiconductor (I) (FIG. 1) into a higher-mobility semiconductor for OTFT applications. The process involves dissolution of lower-mobility semiconductor (I) and a mediating polymer such as for example polystyrene or the like or mixture with poly(methyl methacrylate), polyacrylonitrile, poly(methyl methacrylate-alt-styrene) or poly(vinyl chloride) in an organic solvent such as dichlorobenzene, and subsequently coating or printing the semiconductor solution or ink onto an appropriate substrate, followed by drying with optional thermal annealing if necessary to enable formation of a channel semiconductor for OTFTs. In the presence of the mediating polymer such as polystyrene, (I) readily self-assembled and crystallized out in the mediating polymer matrix, forming highly crystalline channel semiconductors in OTFTs with significantly enhanced field-effect mobility and current on/off ratio, and other desirable field-effect properties that meet impactful OTFT application requirements (such as display backplane electronics and RFID tags).

Materials.

Polymer semiconductors (I) and (II) having the molecular structure depicted in FIG. 1 were synthesized according to published procedures as reported respectively in "*A Stable, Solution processed Polymer Semiconductor with Record High-mobility for Printed Transistors*", Sci. Rep. 2, 754 (2012) and "*Annealing-Free High Mobility Diketopyrrolopyrrole-Quaterthiophene Copolymer for Solution-Processed Organic Thin Film Transistors*", Journal of American Chemical Society, Vol. 133, pp. 2198-2204 (2011), the disclosure of which are hereby incorporated by reference. (I) and (II) were used as semiconductors for fabricating experimental OTFTs. Other materials such as mediating polymers including polystyrene, polyacrylonitrile, poly(methyl methacrylate), and poly(vinyl chloride), and solvents were purchased from Alfa-Aesar and Sigma-Aldrich and used as received.

Film Deposition and Characterization.

The polymer films for characterization and for OTFT fabrication were prepared as follows. The surface of a heavily doped p-Si wafer substrate with a 350-nm thick thermally grown $SiO_2$ surface layer was first modified with OTS-18 according to previously published procedure except that OTS-18 was utilized instead of octyltrichlorosilane. The solutions of polymer semiconductor (I) and an illustrative mediating polymer such as polystyrene or polyacrylonitrile were prepared by dissolution of (I) and mediating polymer in 1,2-dichlorobenzene at a concentration of 4.0 mg/ml. The solutions for the (I)/mediating polymer blends of various weight percentages (wt %) were then prepared by combining the solutions of (I) and mediating polymer in appropriate volume ratios. The resulting (I)/mediating polymer solutions were stirred at 60° C. for 12 h before use. The solutions were spin coated on OTS-18-modified silicon wafer substrates at 1500 rpm for 150 s under ambient conditions. The resulting films were left to dry in a glove box overnight at room temperature before characterization. UV-vis absorption spectra of the films were recorded on a HP 8453 UV-vis spectrophotometer. AFM (Veeco Digital instruments) and SEM (LEO 1530 Field Emission) instruments were used to characterize the morphology and topography of the films. AFM measurement was performed in the tapping mode under ambient conditions. Element distributions in the films were analyzed by XPS depth profile (PHI Model 5802). Out-of-plane GIXRD data were recorded using a Bruker D8 Advance system (Cu X-ray source, 45 kV and 30 mA). Grazing incidence angle was fixed at 0.2° and detector was scanned from 2° to 30°. Crystallinity and elementary analysis of nanowires of (I) were carried out using TEM (TecnaiG2 20 S-TWIN integrated with EDX).

OTFT Fabrication and Characterization.

Bottom-gate, top-contact OTFTs (FIG. 2) were fabricated using the polymer semiconductor films deposited on the OTS-18-modified silicon wafer substrates according to the techniques of the present invention set forth above. Gold source/drain electrodes were deposited on the semiconductor film through a shadow mask with channel length (L) and width (W) features of respectively 80 or 120 µm and 1500 µm by thermal evaporation in vacuum chamber. The resulting OTFT devices were electrically characterized, and optionally annealed at 200° C. for 5 min before subjecting to another electrical characterization. The field-effect characteristics of OTFT devices were measured using a Keithley 2636B two channel source/meter in ambient environment at room temperature. The field-effect mobility in the saturation regime was extracted from the equation: $I_{DS} = \mu C_i (V_G - V_{th})^2 (W/2L)$, where $I_{DS}$ is the drain current, $\mu$ is the field-effect mobility, $C_i$ is the capacitance per unit area of the gate dielectric layer, and $V_G$ is the gate voltage.

The fabrication process involved dissolution of polymer semiconductor (I) (~199 kg mol$^{-1}$) and a mediating polymer such as polystyrene, polyacrylonitrile, or the like in dichlorobenzene at a mediating polymer loading of from 20 to 80 percent by weight (wt %). The resulting solution was spin cast on octadecyltrichlorosilane (OTS-18)-modified silicon wafer (SiO$_2$/Si) substrates to form a polymer thin film, air-dried, and optionally thermally annealed at 200° C. for 5 min. Unlike earlier reported vertical phase separation of semiconductor/polymer blends which separated into two layers, polymer semiconductor (I) in mediating polymer blend underwent segregation and self-assembly into higher crystalline orders and crystallized out within the mediating polymer matrix. The mediating polymer in the blend helped promote molecular self-assembly and crystallization of (I), and the achievement of long-range, high crystalline orders was greatly facilitated through thermal treatment above the glass transition temperature (Tg) of mediating polymer. This was fundamentally different from the attainment of higher crystalline orders of polymer semiconductors in a marginal solvent or with the aid of a high-boiling solvent in the coating solution. In the present case, the mediating polymer remained in the system after deposition, and permitted further molecular organization of (I) during subsequent thermal annealing, leading to a much higher crystallinity and longer-range orders.

Spectroscopic and Microscopic Characterizations

Figure 4:
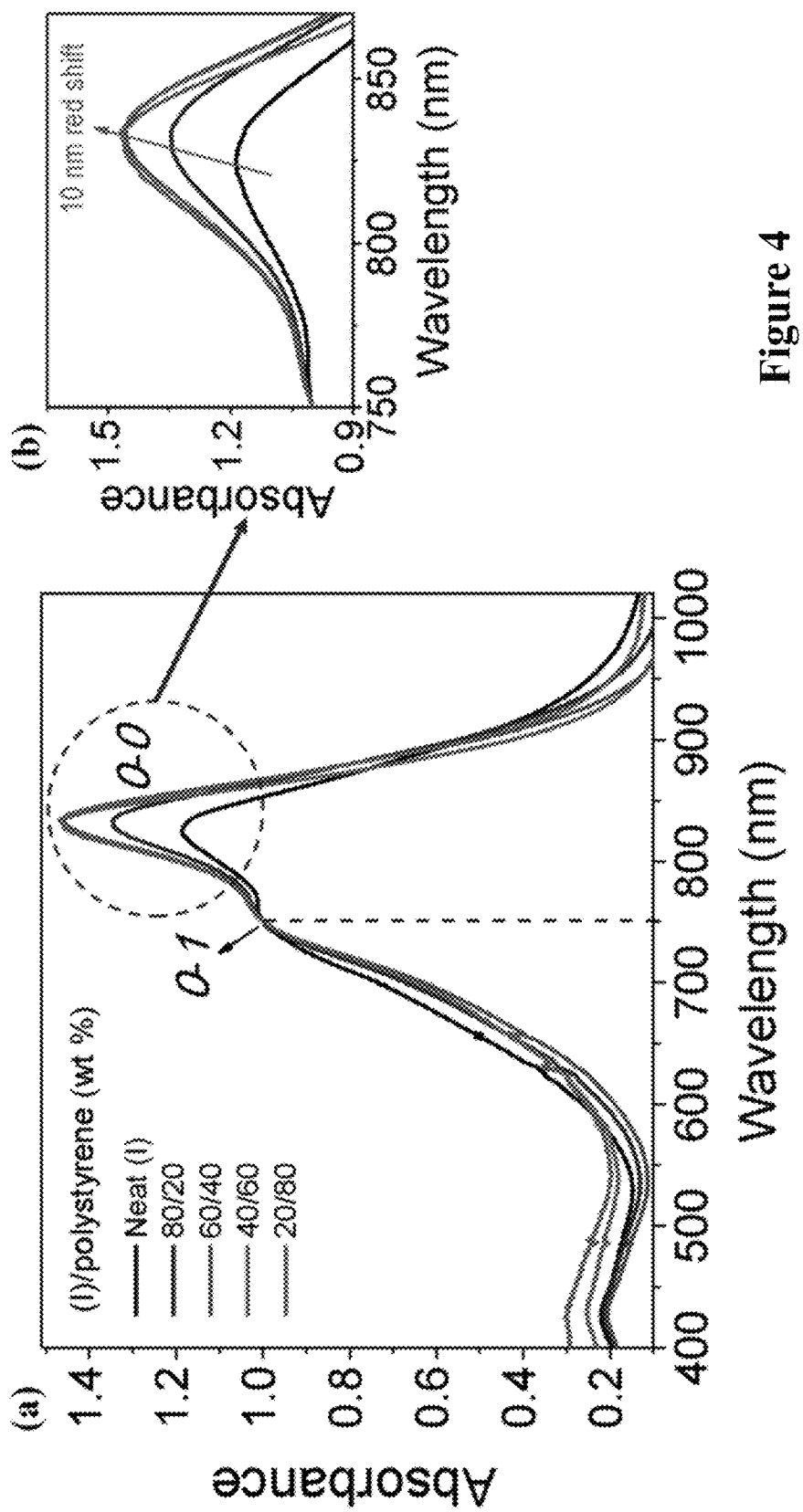
FIG. 4 shows thin-film UV-vis adsorption spectra of polymer semiconductor (I) and its blends with polystyrene; (a) increase in absorbance of absorption peaks at ~825 nm in polystyrene blended films (spectra normalized at ~750 nm); (b) red-shifts of ~825 nm-absorption maxima of polystyrene blended films from that of neat (I) film.

The high degrees of molecular orderings in the (I)/mediating polymer (such as polystyrene) films were reflected spectroscopically in their absorption spectral behaviors (FIG. 4). For example, UV-vis absorption spectra of (I)/polystyrene films displayed the usual dual-band absorption of electron donor-acceptor (D-A) polymer semiconductors with the charge transfer band absorption at ~740-835 nm showing vibrionic splitting characteristic of highly ordered structures (FIG. 4a). With increasing polystyrene loading, the 0-0 vibrational peak (~825 nm) exhibited progressive increase in intensity at the expense of 0-1 vibrational peak intensity (~750 nm), and the increase was most pronounced at about 60 wt % polystyrene. This increase in 825-nm intensity was concomitant a slight spectral red-shift of about 10 nm (FIG. 4b). These were apparently the manifestations of higher molecular orderings from formation of lamellar stacks of (I) in the polystyrene blended films. The red-shift was similar to those observed in other semiconductor polymeric systems, which were attributed to intermolecular $\pi$-$\pi$ stacking.

To understand in greater detail the mediating polymer-assisted structural ordering and crystallization of (I), atomic force microscopic (AFM) studies of the semiconductor films fabricated from the solutions of (I) and (I)/polystyrene in dichlorobenzene were conducted. In AFM topographic images, the neat (I) film displayed mostly grainy, defused nanodomain features without any long-range orders (FIG. 5a). On the other hand, the (I)/polystyrene blended films showed progressive formation of larger, more defined, nanowire-like structures composed of aggregates of nanodomain features (FIGS. 5b and 5c). Distinctive intertwined, long-ranged nanowire network structure was observed at around 60 wt % polystyrene loading (FIG. 5d). Beyond 60 wt % polystyrene loading, degradation in crystalline domain structures occurred leading to decreased nanowire density (FIG. 5e). The critical role of polystyrene in the self-assembly and structural ordering of (I) was evident when (I) was thermally annealed with or without polystyrene. FIGS. 6a and 6b are the AFM and scanning electron microscopy (SEM) images of (I) from (I)/polystyrene (40/60 wt %) film thermally annealed (200° C. for 5 min.) after polystyrene removal (i.e., annealed in the absence of polystyrene), showing defused nanowire domain structures. In contrast, well-defined nanowire network features of (I) with nanowire lengths as long as over 1 µm could clearly be visualized (FIG. 5f/FIG. 6c and FIG. 6d) when polystyrene was removed from thermally annealed (I)/polystyrene (40/60 wt %) film (i.e. annealed in the presence of polystyrene). These results strongly suggested that at temperatures above Tg of polystyrene, the cooperative shifting motion of polystyrene chain segments helped propel the movement of polymer chains of (I), facilitating their self-assembly into nanowire network structures. In essence, the polystyrene behaved like a "solvent", permitting crystallization of (I) to propagate to the extent when highly ordered, crystalline structures "precipitated" out in the matrix.

Figure 7:
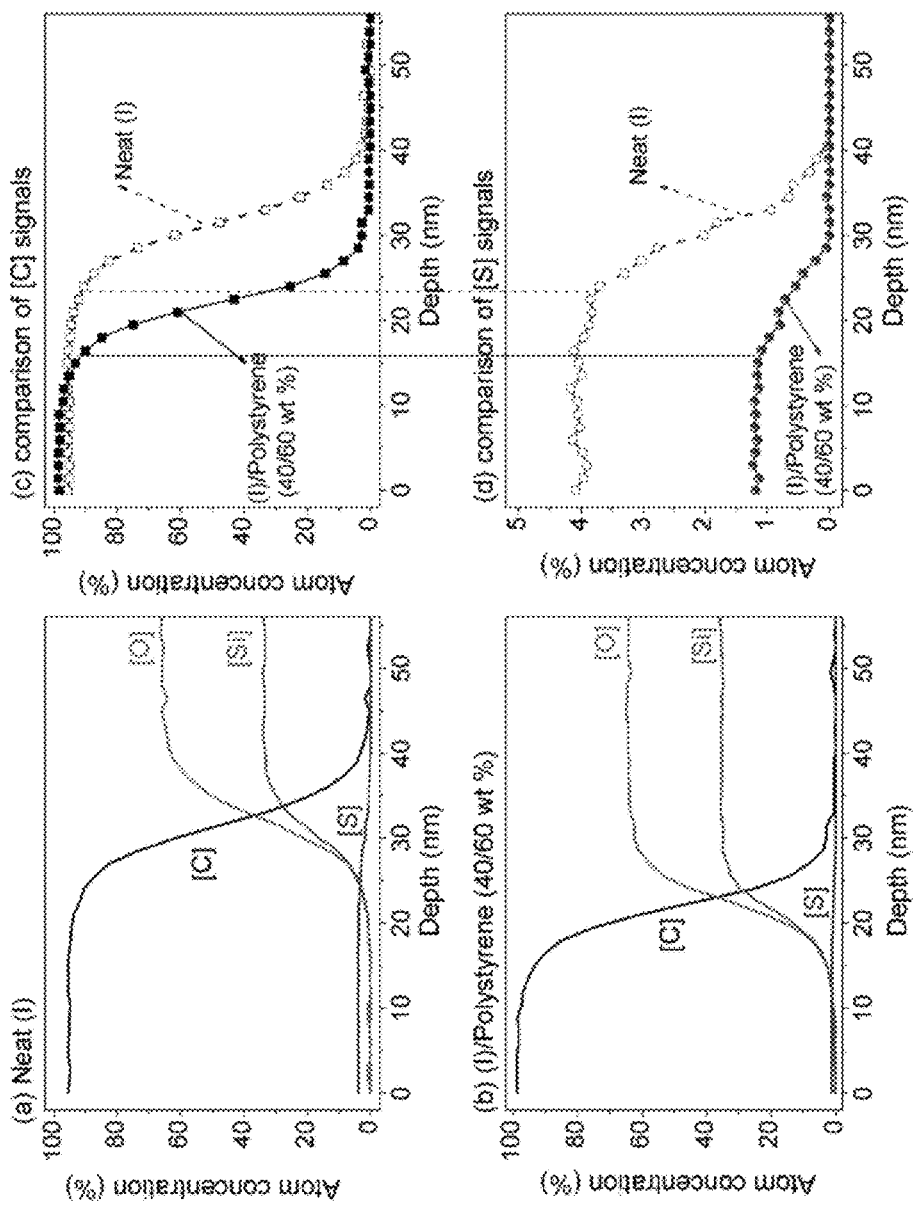
FIG. 7 shows the X-ray photoelectron spectroscopy (XPS) depth profiles of neat polymer semiconductor (I) and (I)/polystyrene (40/60 wt %) films. (a) and (b) are depth profiles of elements (C, S, O and Si) in respectively neat (I) and (I)/polystyrene film; (c) relative concentrations of carbon as a function of film depth in neat (I) and (I)/polystyrene film; and (d) relative concentrations of sulfur as a function of film depth in neat (I) and (I)/polystyrene film.

X-ray photoelectron spectroscopy (XPS) depth profiling analysis revealed a relatively uniform distribution of (I) in the (I)/polystyrene blend film. FIGS. 7a and 7b showed the relative ratios of carbon, sulfur, oxygen and silicon elements as a function of the film depth for neat (I) and (I)/polystyrene (40/60 wt %) films. The carbon signals came from both (I) and polystyrene, while the sulfur signal was from (I). The oxygen and silicon signals were primarily from the silicon wafer substrate with a very minor contribution from (I). In both cases, the carbon signals were present across the film thicknesses and decreased gradually and disappeared towards the bottom of the films (FIG. 7c), indicating that both polystyrene and (I) were present throughout the bulk of the films. Likewise, the blown-up figure (FIG. 7d) displayed relatively uniform distribution of sulfur signal across the thickness of the film, affirming relatively uniform distribution of nanowire network of (I) in the (I)/polystyrene blend film. This was distinctively different from vertical phase separation where a dual-layer film structure resulted in the prior art.

Figure 8:
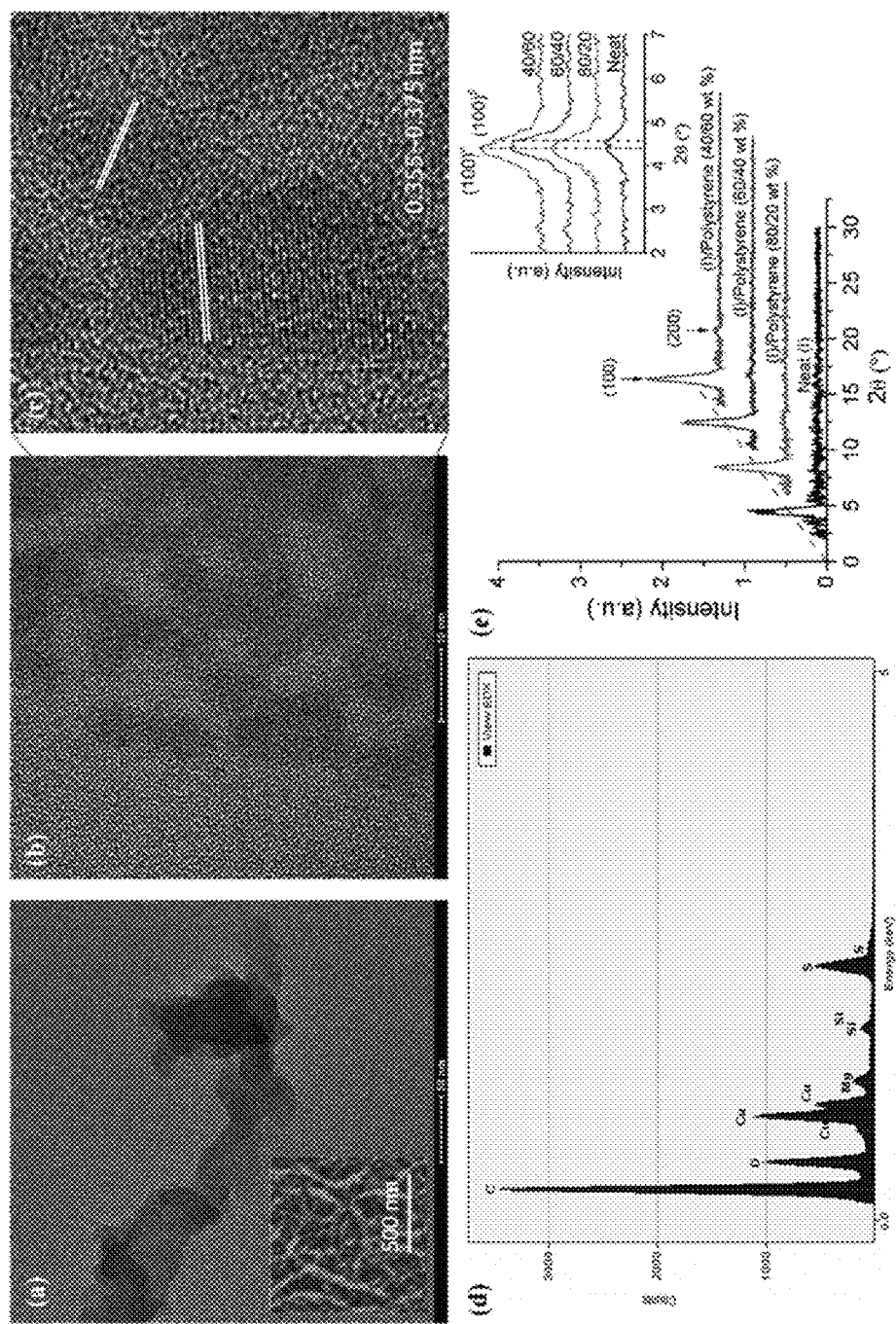
FIG. 8 shows the Transmission Electron Microscopy (TEM) images and Energy Dispersive X-Ray (EDX) analysis of polymer semiconductor (I) from a thermally annealed (I)/polystyrene (40/60 wt %) film after polystyrene removal and Grazing Incidence X-ray Diffraction (GIXRD) of (I) and its polystyrene blends. (a) TEM image of a nanowire fragment of (I) showing aggregate of nanodomain structures; insert displaying AFM topographic image of portion of corresponding nanowire network; (b) crystalline domains within nanodomain structure of (I); (c) visually distinctive π-π stacking structures of the crystalline domains of (I); (d) EDX analysis showing presence of sulfur element in the nanowire network of (I); and (e) GIXRD diffraction patterns of (I) as a function of polystyrene loading, showing appearance of (200) diffraction as polystyrene loading increased; insert increase in $(100)^\alpha$ phase intensity and concomitant decrease in $(100)^\beta$ phase intensity with increased polystyrene loading.

Transmission electron microscopic (TEM) analysis of nanowire network of polymer semiconductor (I) was carried out to gain an insight into the nanowire structure of (I). The thermally annealed (I)/polystyrene (40/60 wt %) film on OTS-18-modified silicon wafer substrate was first soaked in toluene for 2 min to remove the polystyrene. The remaining nanowire network film of (I) was carefully removed and placed on a lacey carbon coated Cu grid and subject to TEM examination. FIG. 8a showed a low-magnification TEM image of a segment of a nanowire composed of an aggregate of irregular nanodomain structures of 30-80 nm in size, and a portion of the corresponding intertwined nanowire network of (I) could be seen in the AFM topographic image provided in FIG. 8a insert. Energy-dispersive X-ray (EDX) spectroscopy (FIG. 8d) of the film revealed presence of sulfur element in these nanodomain structures, confirming the identity of (I) for the nanowire network. A high-definition TEM image of one of nanodomain structures showed highly crystalline domains within the structure (FIG. 8b) with visually discernible π-π stacking features having a π-π distance ranging from about 0.355 to 0.375 nm (FIG. 8c). No particular preferential orientations in the plane normal to the π-π stacking were adopted by these π-π stacking domains. Accordingly, this polycrystalline nanowire structure was quite different from the single-crystal nanowires where polymer chains were arranged along the length of the wire with preferential π-π stacking direction normal to the length of the nanowire.

X-Ray Diffraction Measurements

Out-of-plane grazing incidence X-ray diffraction (GIXRD) measurements (FIG. 8e) were conducted to further explore the structural transitions of (I) in the presence of polystyrene. The neat (I) film showed a weak and broad (100) diffraction with two peaks corresponding to two polymorphic phases, namely $(100)^\alpha$ (α-phase) at $2\theta=4.34°$ and $(100)^\beta$ (β-phase) at $2\theta=4.55°$ (FIG. 8e, insert). The presence of polymorphic phases, observed previously in other copolymer systems, was thought to be damaging to charge transport due to the charge-carrier scattering or blocking effects in the channel region. As the polystyrene loading increased, an increase in α-phase intensity with a concomitant decrease in β-phase intensity was observed. At 60 wt % polystyrene loading, the (100) diffraction became predominantly α-phase diffraction. In addition, (200) diffraction at $2\theta=8.68°$ also became discernible with increased polystyrene loadings, indicating increased crystallinity of (I) in the (I)/polystyrene film (FIG. 8e). These results were consistent with the formation of long-range nanowire network (FIGS. 5d and 5f) in the (I)/polystyrene (40/60 wt %) film, which would be conducive to charge carrier transport. No π-π stacking diffraction at $2\theta\sim25°$ was noted in the out-of-plane XRD pattern of the film (FIG. 8e), reflecting that (I) assumed an edge-on orientation relative to the substrate even within the nanowire network.

OTFT Performance Characteristics

Figure 2:
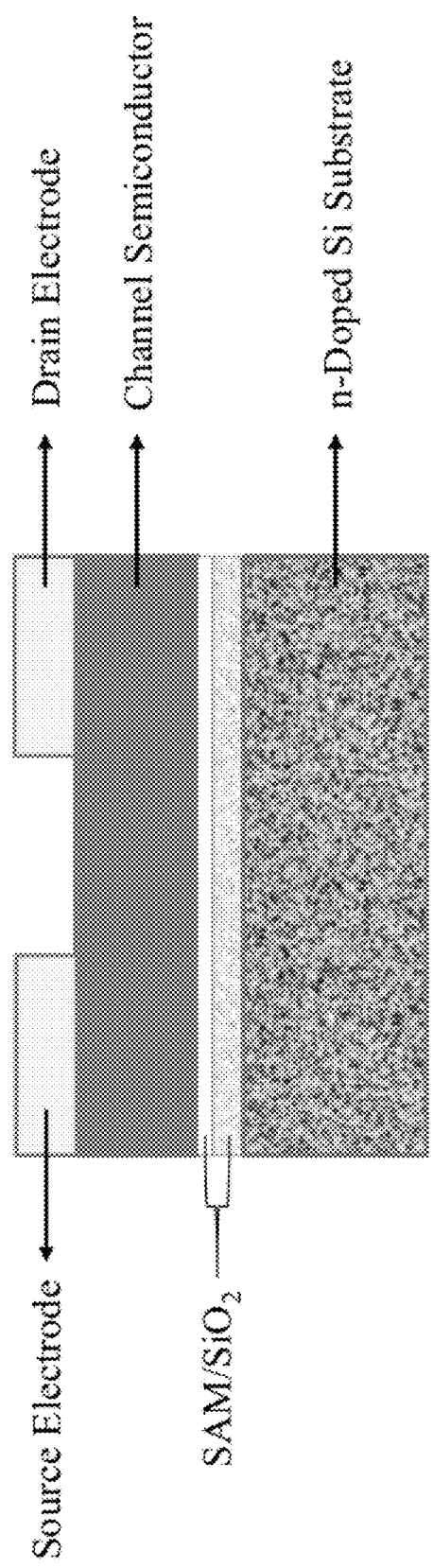
FIG. 2 shows the schematic diagram of an OTFT test device.
Figure 3:
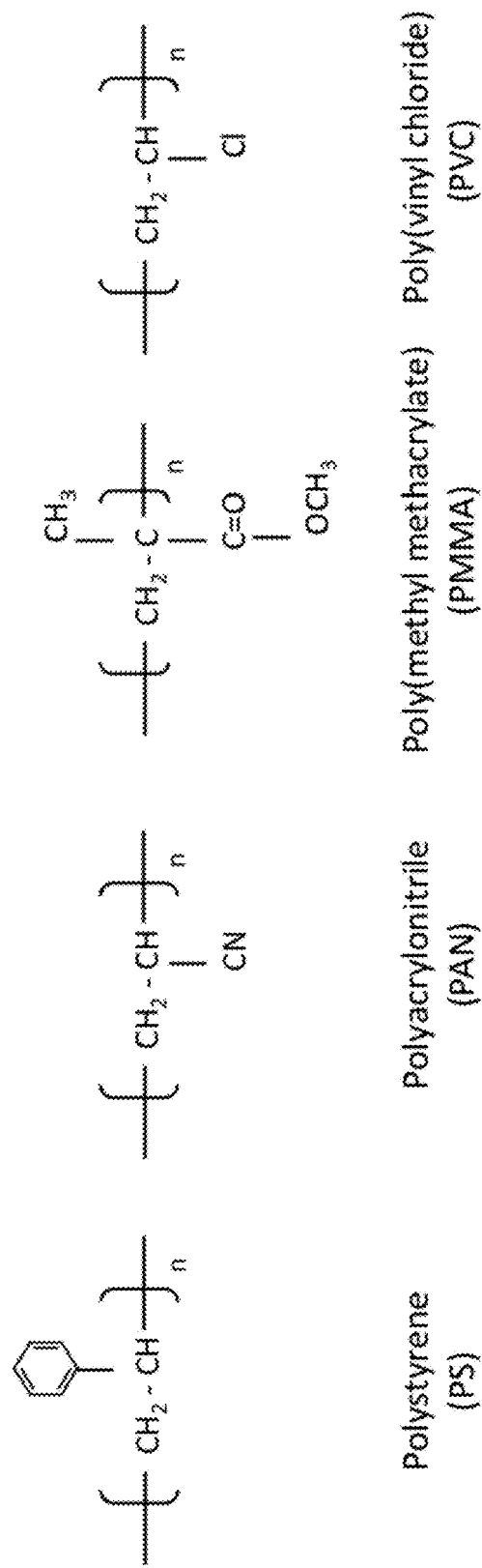
FIG. 3 shows the chemical structures of illustrative mediating polymers, polystyrene, polyacrylonitrile, poly(methyl methacrylate), and poly(vinyl chloride).
Figure 9:
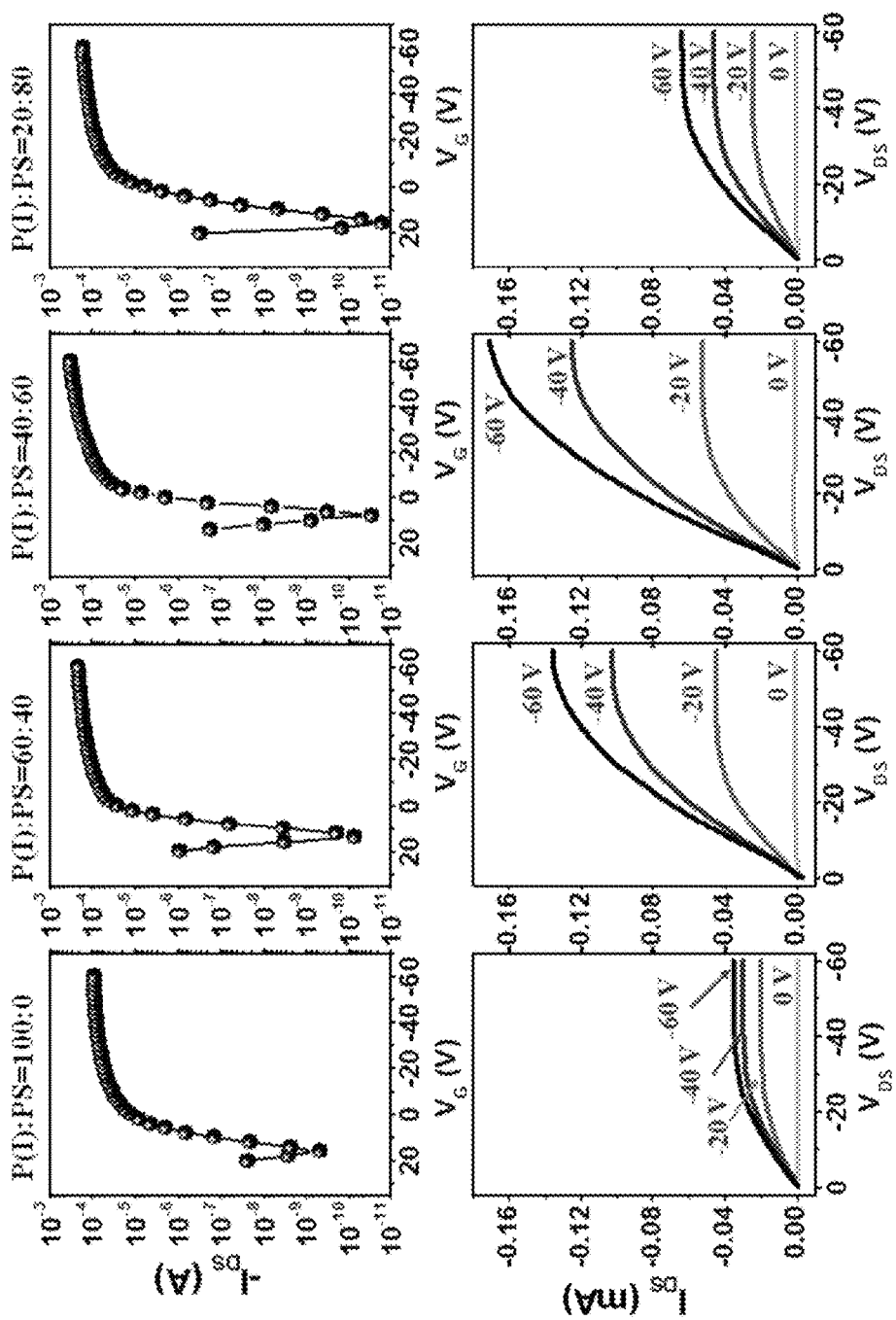
FIG. 9 shows typical transfer characteristics and output curves of OTFTs with (I)/Polystyrene channel semiconductors of different levels of polystyrene incorporation.

The electrical performance characteristics of the polymer semiconductor (I)/polystyrene films as channel semiconductors in OTFTs were investigated using a bottom gate-top contact transistor configuration (FIG. 2). Typical transfer and output curves of OTFTs with channel semiconductor films of (I) and (I)/polystyrene of various compositions are shown in FIG. 9, and the extracted field-effect mobility in the saturated regime, current on/off ratio, threshold voltages summarized in Table 2. As noted, the mobility and on/off ratio increased with polystyrene loading in the (I)/polystyrene film up to about 60 wt %, where a mobility as high as 8.25 $cm^2V^{-1}s^{-1}$ and on/off ratio of $\sim10^7$ were attained. These results represented more than a factor of five higher in mobility and two orders of magnitude better in on/off ratio than similar devices with neat (I) as the channel semiconductor (mobility $\sim1.5$ $cm^2V^{-1}s^{-1}$ and on/off ratio $\sim10^5$). The substantially higher mobility correlate very well with the beneficial, predominantly single α-polymorph phase and interpenetrating nanowire network of (I) in mediating polystyrene matrix, which served as a long-range percolated pathway for efficient charge transport between source/drain electrodes. The extremely high on/off ratio was attributable to the insulating nature of the polystyrene matrix which helped suppress leakage current. Beyond 60 wt % polystyrene loadings, degradation in charge transport properties was observed. This was largely due to the dilution effect, disrupting the interconnectivity of the nanowire network as could be seen in the (I)/polystyrene (20/80 wt %) film where the nanowire network appeared to be significantly degraded (FIG. 5e). The observed mobility was much lower at 3.34 $cm^2V^{-1}s^{-1}$ while maintaining the same high on/off ratio of $\sim10^7$ owing to the insulating effect of polystyrene.

Figure 10:
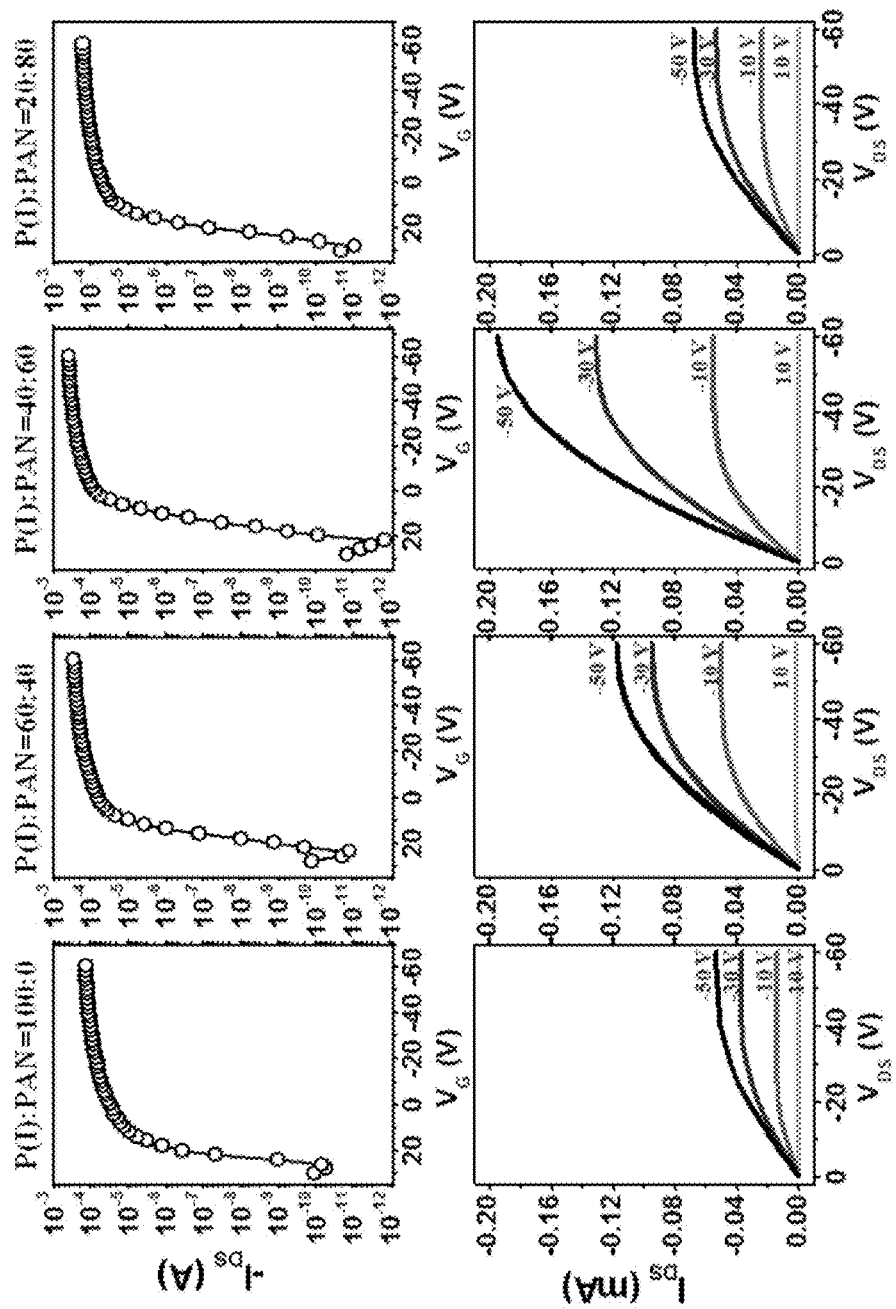
FIG. 10 shows representative transfer characteristics and output curves of OTFTs with (I)/Polyacrylonitrile channel semiconductors of different levels of polyacrylonitrile incorporation.

The effect of mediating polymer-assisted structural ordering of polymer semiconductor and thus the transistor performance was even more pronounced and impressive when polyacrylonitrile was used as the mediating polymer. FIG. 10 and Table 1 show respectively the transfer characteristics/output curves and field-effect performance characteristics of OTFTs with channel semiconductors fabricated from (I)/polyacrylonitrile solutions of various compositions. It can be noted that optimum OTFT performance was realized when the (I):polyacrylonitrile percent ratio by weight was about 40:60 where field-effect mobility of about 16 $cm^2V^{-1}s^{-1}$ and on/off ratio of $10^8$ were obtained. These represented one order of magnitude enhancement in mobility and three orders of magnitude improvement in on/off ratio from those of OTFTs with channel semiconductor fabricated from (I) without polyacrylonitrile.

Figure 11:
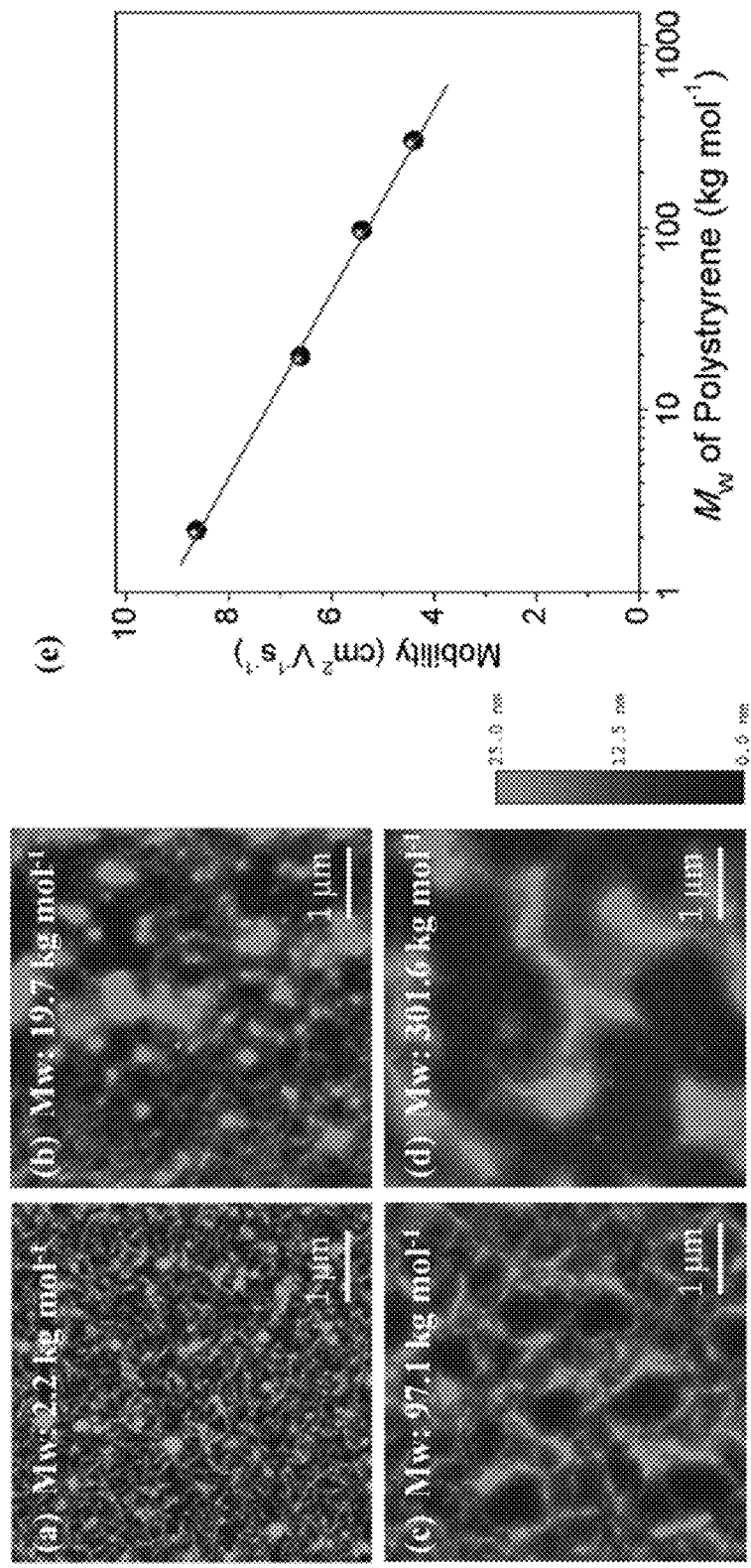
FIG. 11 shows the AFM topographic images of thermally annealed films of (I) in monodispersed polystyrenes of various MWs: (a) Mw of polystyrene=2.2 kg $mol^{-1}$; (b) Mw of polystyrene=19.7 kg $mol^{-1}$; (c) Mw of polystyrene=97.1 kg $mol^{-1}$; and (d) Mw of polystyrene=301.6 kg $mol^{-1}$; (e) Field-effect mobility as a function of Mw of polystyrene, showing inverse exponential dependence of mobility of (I) on Mw of polystyrene.

Further support for mediating polymer such as polystyrene as a medium of crystallization for (I) came from the dependence of mobility of (I)/polystyrene semiconductor on polyacrylonitrile molecular weight. The molecular orders of (I) in (I)/polystyrene film and thus the mobility would be expected to decrease as the viscosity of the medium or molecular weight of polystyrene goes up since higher viscosity would hamper the movement of (I), thus inhibiting its self-assembly into higher crystalline orders. For the present invention, monodispersed polystyrenes of weight average molecular weight (Mw) ranging from 2.2 to 300 kg $mol^{-1}$ at a polystyrene loading of 60 wt % were used. AFM topographic images of thermally annealed films of (I)/polystyrene showed presence of nanowire network features in the film with polystyrene Mw of 2.2 kg $mol^{-1}$ (FIG. 11a). The network features of (I) degraded gradually as the Mw of polystyrene went up, and became non-existent beyond Mw of $\sim19$ kg $mol^{-1}$, when isolated islands or blocks of (I) appeared within the polystyrene matrix (FIGS. 11b-11d). These observations were consistent with the impediment of self-assembly of (I) into long-range, higher crystalline orders as the viscosity or Mw of polystyrene was increased. Consequently, degradation in field-effect mobility with increasing Mw of polystyrene was also observed. FIG. 11e showed the inverse exponential dependence of mobility on Mw of polystyrene, suggesting that low-viscosity or low- Mw polystyrene matrix would be most efficient in facilitating achievement of long-range crystalline orders of (I).

Hydrocarbon Binder

For low-cost manufacturing of OTFTs, it is highly desirable to engage a high-speed roll-to-roll process such that the throughput can be greatly enhanced to drive down the production costs. To enable low-cost manufacturing, it is also desirable that the production be carried out in ambient conditions without an added, often costly thermal annealing step. Accordingly, a channel semiconductor process that can be carried out at room temperature without the need for post-coating/printing high-temperature thermal treatments would be ideally suited for low-cost OTFT production. Most current fabrications of OTFT channel semiconductors, particularly those utilizing organic polymer semiconductors often involve a thermal annealing step for channel semiconductors to improve their performance. Thermal annealing may take as much as 30 minutes to over several hours in some cases, and drastically slow down manufacturing speeds, leading to reduced production throughputs. In addition, the processing and fabrication of many organic semiconductors require a dry and inert atmosphere, and this would incur additional costs for implementing the precautionary protective measures. Accordingly, it is highly desirable that the OTFT channel semiconductors be fabricated at room temperature in ambient conditions without having to insulate their fabrication from atmospheric oxygen, moisture, and ambient light, or the need for thermal annealing. It is also a mandatory requirement that the resulting OTFT devices are able to deliver performance functionalities such as field-effect mobility and current on/off ratio, etc. that meet application requirements.

It has been determined that many or all of the above-mentioned complications can be satisfactorily circumvented if a hydrocarbon binder material is incorporated in the semiconductor solution or ink. Specifically, the incorporation of a hydrocarbon binder or mixture of hydrocarbon compounds into the semiconductor solution or ink has been found to be advantageous as this enables fabrication of a channel semiconductor at lower temperatures such as, for example, room temperature without having to thermally anneal the semiconductor after deposition. As a consequence, the present invention has effectively made possible fabrication of a channel semiconductor for OTFTs at room temperature without the need for thermal annealing as commonly practiced in many semiconductor processes. This new solution process of the present invention also permits utilization of a lower concentration of semiconductor in the solution, yielding a more stable and fluidic solution or ink, thus enabling facile coating or printing of semiconductors. The solution or ink comprising a hydrocarbon binder or hydrocarbon compounds and an organic semiconductor in a suitable solvent affords a fluidic medium for the semiconductor molecules to self-assemble to higher degrees of molecular ordering. Through incorporation of a hydrocarbon binder in the coating solution or ink, the dissolved organic semiconductor can be processed into semiconductor films of higher molecular orders, resulting in significantly enhanced charge transport efficacy, and superior OTFT properties without a high-temperature thermal annealing step. The hydrocarbon binder that can be utilized in the present invention is preferably a mixture of hydrocarbon compounds represented by, but not limiting to, the general formula, $C_mH_{2m+2}$, where m is a positive integer ranging preferably from 10 to over 100. The hydrocarbons may be straight-chain aliphatic hydrocarbons or optionally be aliphatic hydrocarbons containing aromatic substituents such as for example, a phenyl, tolyl, or their derivatives such as $C_6H_5$—R—$CH_3$, $CH_3$—$C_6H_5$—R—$CH_3$, and wherein R is a hydrocarbon chain including branched hydrocarbon chain represented by $C_nH_{2n}$. It is understood that other additives such as other hydrocarbon derivatives, aromatic compounds, or polymer additives can be incorporated in conjunction with the hydrocarbon binders.

Illustrative examples of hydrocarbon binders or hydrocarbon compounds which are of interest to the present invention include the following:

$$CH_3—(CH_2)_x—CH_3 \quad\quad\quad (IV)$$

$$CH_3—C_xH_{2x}—CH_3 \quad\quad\quad (V)$$

where x is a positive integer ranging from about 8 to over 100.

The hydrocarbon binders that are of interest may be a mixture of hydrocarbon compounds such as (IV) or (V) with x varying from for example about 8 to over 100. What is practically important is that the melting point of the hydrocarbon compounds or binder can be above room temperature. A desirable melting point generally ranges from 30° C. to over 100° C. Illustrative specific examples of hydrocarbon binders include paraffin wax, household candle wax, polyethylene wax, Parafilm® wax, and the like.

For example, when (I) was fabricated into a channel semiconductor for OTFTs from its solution in dichlorobenzene at room temperature, it provided a field-effect mobility of only about 0.6 cm$^2$V$^{-1}$s$^{-1}$ and current on/off ratio of about $10^5$. The OTFTs with (I) as channel semiconductor only achieved a higher mobility of about 1.5 cm$^2$V$^{-1}$s$^{-1}$ and on/off ratio of over $10^6$ after thermally annealed at 200° C. for 10 min. In contrast, when OTFTs with channel semiconductor (I) fabricated from solutions or inks of (I) and a hydrocarbon binder in a suitable solvent such as dichlorobenzene at room temperature, field-effect mobility of 1 to over 5 cm$^2$V$^{-1}$s$^{-1}$ and on/off ratio in excess of $10^5$ were obtained without the need for high-temperature thermal annealing. The process of this invention thus provides a viable and practical approach through which an organic semiconductor can be readily solution fabricated or printed at room temperature into a channel semiconductor for OTFTs to provide useful semiconductor functionalities for practical application in electronic devices. This would greatly simplify the manufacturing processes, thus enabling low-cost electronic device production. Typically, the process involves dissolution of a semiconductor and a hydrocarbon binder in a solvent such as chlorobenzene or dichlorobenzene followed by solution coating or printing to form a channel semiconductor for OTFTs. In general, the hydrocarbon binder loading in the channel semiconductor composition ranges from about 10 percent to 90 percent by weight.

Preferably, the said hydrocarbon binder loading in the resulting channel semiconductor composition ranges from 45 percent to 65 percent by weight. Specifically, a semiconductor such as (I), (II) or the like and a hydrocarbon binder of general formula, $C_mH_{2m+2}$ and the like such as paraffin wax, household candle wax, polyethylene wax or Parafilm® wax at appropriate weight percentages are dissolved in a suitable processing solvent such as dichlorobenzene, with optional heating to dissolve the materials if necessary, to form a solution or ink. Other optional binder materials may also be added to the solution or ink, provided that the objectives of the invention are satisfied. The solution may be filtered through a syringe filter and then spin cast or printed onto a suitable substrate to form a thin semiconductor film after drying. Facile molecular self-assembly of semiconductor molecules and their eventual crystallization into highly crystalline orders occurs at room temperature. The degree of semiconductor molecular ordering, thus field-effect mobility of the resulting OTFTs, increases with the hydrocarbon binder loading in the channel semiconductor composition of up to about 70% by weight.

The following examples are provided to illustrate the invention, which by no means are exhaustive. These are intended to be illustrative only and are not intended to limit the scope of the invention. The following specific examples are provided to illustrate the invention, which by no means are exhaustive. They are intended to be illustrative only and are not intended to limit the scope of the invention.

Example 1

A comparative control device was first fabricated as follows: A top-contact, bottom-gate OTFT test device with the structure configuration as illustrated in FIG. 2 was prepared in ambient conditions without taking any special precautions to exclude air, moisture and ambient light. A heavily n-doped Si wafer with a ~300-nm thermal $SiO_2$ surface layer was used as the substrate with the n-doped Si wafer serving as a common gate electrode. The $SiO_2$ surface of the substrate was sequentially cleaned by ultrasonication for 10 minutes each in deionized water, acetone, and 2-proponol. After cleaning, the substrate was blown dried with nitrogen gas and UV/ozone treated for 5 minutes. It was then re-immersed in a solution of octydecyltrichlorosilane (OTS-18) in toluene (0.1 M) at 60° C. for 30 minutes, yielding a silane self-assembled monolayer (SAM) on the $SiO_2$ surface. The resulting SAM-$SiO_2$ layer was used as the gate dielectric. A solution of (I) in dichlorobenzene (4 mg/mL) was then deposited on top of the silane-modified Si/$SiO_2$ surface by spin coating at 1500 rpm for 150 seconds and dried in air overnight. Thereafter, gold source/drain electrode pairs were deposited on top of the semiconductor layer by thermal evaporation through a metal shadow mask bearing source/drain electrode pair features with various channel lengths and widths, thus forming a series of OTFT devices of various dimensions. The OTFT devices were subsequently annealed at 200° C. for 5 min and then cooled down to room temperature before subjecting to electrical evaluation.

Another series of devices were fabricated using dichlorobenzene solutions of semiconductor (I) and polyacrylonitrile (PAN) at percentage ratios by weight of (I):PAN ranging from 80:20 to 20:80 with the solution concentration maintained at 4 mg solid/mL. The fabrication was carried in accordance to the procedure for the control device and thermally annealed as before. The following Table 1 summarizes the field-effect properties of the OTFT devices:

TABLE 1

| Device | Semiconductor (I):PAN Percent by Weight | Field-effect Mobility $cm^2V^{-1}s^{-1}$ (average value) | Current On/off ratio |
|---|---|---|---|
| 1 (Control) | 100:0 | 1.51 (1.16) | $2 \times 10^5$ |
| 2 | 80:20 | 2.91 (2.16) | $2 \times 10^6$ |
| 3 | 60:40 | 6.65 (5.15) | $2 \times 10^7$ |
| 4 | 40:60 | 15.9 (11.1) | $1 \times 10^8$ |
| 5 | 20:80 | 3.18 (2.83) | $1 \times 10^7$ |

The above results clearly show that the performance of the OTFT devices fabricated with a mediating polymer, PAN (devices 2 through 5) were superior, in both field-effect mobility and current on/off ratio, to those of control device 1 without a mediating polymer.

Example 2

A series of polymer-mediated devices using semiconductor (I) and polystyrene (PS) were fabricated in accordance with the procedure of Example 1 except that PS was used in place of PAN. The following Table 2 summarizes the results of electrical evaluation:

TABLE 2

| Device | Semiconductor (I):PS Percent by Weight | Field-effect Mobility $cm^2V^{-1}s^{-1}$ (average value) | Current On/off ratio |
|---|---|---|---|
| 1 (Control) | 100:0 | 1.51 (1.16) | $2 \times 10^5$ |
| 2 | 80:20 | 4.05 (3.39) | $2 \times 10^6$ |
| 3 | 60:40 | 6.98 (5.80) | $3 \times 10^6$ |
| 4 | 40:60 | 8.25 (6.67) | $1 \times 10^7$ |
| 5 | 20:80 | 3.34 (2.57) | $1 \times 10^7$ |

Once again, the above results show that the performance of the OTFT devices fabricated with a mediating polymer, PS (devices 2 through 5) were superior, in both field-effect mobility and current on/off ratio, to those of control device 1 without a mediating polymer.

Example 3

A polymer-mediated device using semiconductor (II) and PAN was fabricated in accordance with the procedures of Example 1 except that (II) was used in place of (I). The following Table 3 summarizes the results of electrical evaluation:

TABLE 3

| Device | Semiconductor (II):PAN Percent by Weight | Field-effect Mobility $cm^2V^{-1}s^{-1}$ | Current On/off Ratio |
|---|---|---|---|
| 1 (Control) | 100:0 | 0.45 | $2 \times 10^6$ |
| 2 | 50:50 | 2.26 | $1 \times 10^7$ |

The above results demonstrate that device 2, which has incorporated a mediating polymer, PAN, in its channel semiconductor layer, was superior in performance, in both field-effect mobility and current on/off ratio, to the corresponding control device 1 without a mediating polymer.

Example 4

A polymer-mediated device using semiconductor (III) and PAN were fabricated in accordance with the procedures of Example 3 except that (III) was used in place of (II). The following Table 4 summarizes the results of electrical evaluation:

TABLE 4

| Device | Semiconductor (III):PAN Percent by Weight | Field-effect Mobility, $cm^2V^{-1}s^{-1}$ | Current On/off ratio |
|---|---|---|---|
| 1 (Control) | 100:0 | 0.018 | $0.5 \times 10^2$ |
| 2 | 50:50 | 0.073 | $2 \times 10^5$ |

The above results demonstrate that device 2, which has incorporated a mediating polymer, PAN, in its channel semiconductor layer, was superior in performance, in both field-effect mobility and current on/off ratio, to the corresponding control device 1 without a mediating polymer.

Example 5

A control device and a polymer-mediated device using semiconductor (I) and poly(methyl methacrylate) (PMMA) were fabricated in accordance with the procedures of Example 1. The following Table 5 summarizes the field-effect mobility and current on/off ratio obtained after annealing at 200° C.:

TABLE 5

| Device | Semiconductor (I):PMMA Percent by Weight | Field-effect Mobility $cm^2V^{-1}s^{-1}$ | Current On/off ratio |
|---|---|---|---|
| 1 (Control) | 100:0 | 1.51 | $2 \times 10^5$ |
| 2 | 40:60 | 1.36 | $2 \times 10^6$ |

Example 6

A control device and a polymer-mediated device using semiconductor (I) and polyvinyl chloride (PVC) were fabricated in accordance with the procedures of Example 1. The following Table 6 summarizes the field-effect mobility and current on/off ratio obtained after annealing at 200° C.:

TABLE 6

| Device | Semiconductor (I):PVC Percent by Weight | Field-effect Mobility $cm^2V^{-1}s^{-1}$ | Current On/off ratio |
|---|---|---|---|
| 1 (Control) | 100:0 | 1.51 | $2 \times 10^5$ |
| 2 | 40:60 | 1.07 | $2 \times 10^6$ |

EXAMPLE 5 and EXAMPLE 6 show that the performance properties with other mediating polymers (PMMA and PVC) are mixed, i.e., the field-effect mobility is poorer while the current on/off ratio is better than those without a mediating polymer.

Example 7

A comparative control OTFT device was first fabricated as follows: A top-contact, bottom-gate OTFT test device with the device configuration as illustrated in FIG. 2 was prepared in ambient conditions without taking any special precautions to exclude air, moisture and ambient light. A heavily n-doped Si wafer with a ~200-nm thermal $SiO_2$ surface layer was used as the substrate with n-doped Si wafer serving as a common gate electrode. The $SiO_2$ surface layer was cleaned by oxygen plasma or UV ozone treatment, and then cleaned by immersing in acetone and ultrasonicated for 10 minutes, withdrawn and blow-dried with nitrogen gas. It was then immersed in a piranha solution (60 ml of $H_2SO_4$:30 ml of $H_2O_2$) for 8 minutes, followed by rinsing with deionized water, and then re-immersed in a solution of octydecyltrichlorosilane (OTS-18) in toluene at 60° C. for 20 minutes. Subsequent rinsing with toluene and then blow-drying with nitrogen gas resulted in the formation of a silane self-assembled monolayer (SAM) on the $Si/SiO_2$ surface. A solution of (I) in dichlorobenzene (4 mg/mL) was deposited on top of the silane-modified $Si/SiO_2$ surface by spin coating at 1000 rpm for 60 seconds and vacuum dried for at least 12 hours. Thereafter, gold source/drain electrode pairs were deposited on top of the semiconductor layer by thermal evaporation of gold through a metal shadow mask bearing source/drain electrode pair features with various channel lengths and widths, thus forming a series of OTFT devices of various dimensions. Electrical evaluation gave an average field-effect mobility of 0.6 $cm^2V^{-1}s^{-1}$ and current on/off ratio of $10^4$-$10^5$.

Another series of OTFT devices were fabricated with dichlorobenzene solutions of semiconductor (I) and Parafilm® wax at (I):Parafilm® wax weight percent ratios ranging from 20:80 to 80:20 at a solution concentration of 4 mg solid/mL. The fabrication was carried in accordance with the procedure for the control device. The following Table 7 summarizes the field-effect properties of the OTFT devices:

TABLE 7

| Device | Semiconductor (I):Parafilm ® Wax Percent by Weight | Field-effect Mobility $cm^2V^{-1}s^{-1}$ | Current On/off Ratio |
|---|---|---|---|
| 1 (Control) | 100:0 | 0.6 | $10^4$-$10^5$ |
| 2 | 80:20 | 2.9 | $10^4$-$10^5$ |
| 3 | 60:40 | 3.4 | $10^5$-$10^6$ |
| 4 | 40:60 | 4.5 | $10^5$-$10^7$ |
| 5 | 20:80 | 1.4 | $10^4$-$10^5$ |

The above results clearly show that the performance of OTFT devices with polymer semiconductor (I) fabricated with Parafilm® wax was superior in performance over the corresponding control device 1 without Parafilm® wax.

Example 8

A comparative control OTFT device and a hydrocarbon binder-incorporated OTFT device using semiconductor (II) and Parafilm® wax at a (II):Parafilm® wax weight percent ratio of 40:60 were fabricated in accordance with the procedure of Example 7 except that (II) was used instead of (I). The following Table 8 summarizes the results of electrical evaluation:

TABLE 8

| Device | (I):Parafilm ® Wax Percent by Weight | Field-effect Mobility $cm^2V^{-1}s^{-1}$ | Current On/off Ratio |
|---|---|---|---|
| 1 (Control) | 100:0 | 0.4 | $10^4$-$10^5$ |
| 2 | 60:40 | 2.1 | $10^5$-$10^6$ |

The above results again clearly show that the performance of OTFT device 2 with polymer semiconductor (II) fabricated with Parafilm® wax was superior in performance over the corresponding control device 1 without Parafilm® wax.

Example 9

A comparative control OTFT device and a hydrocarbon binder-incorporated OTFT device using semiconductor (I) and a household candle wax were fabricated in accordance with the procedures of Example 7 except that candle wax was utilized in place of Parafilm® wax. The following Table 9 summarizes the results of electrical evaluation:

TABLE 9

| Device | Semiconductor (I):Candle Wax Percent by Weight | Field-effect Mobility $cm^2V^{-1}s^{-1}$ | Current On/off ratio |
|---|---|---|---|
| 1 (Control) | 100:0 | 0.6 | $10^4$-$10^5$ |
| 2 | 40:60 | 1.61 | $10^5$-$10^6$ |

The above results again clearly show that the performance of OTFT device 2 with polymer semiconductor (I) fabricated with candle wax was superior in performance over the corresponding control device 1 without candle wax.

Example 10

A comparative control device and a hydrocarbon binder-incorporated OTFT device using semiconductor (I) and polyethylene wax were fabricated in accordance with the procedures of Example 7 except that polyethylene wax was utilized in place of Parafilm® wax. The following Table 10 summarizes the results of electrical evaluation:

TABLE 10

| Device | Semiconductor (I):Polyethylene Wax Percent by Weight | Field-effect Mobility $cm^2V^{-1}s^{-1}$ | Current On/off ratio |
|---|---|---|---|
| 1 (Control) | 100:0 | 0.6 | $10^5$-$10^6$ |
| 2 | 40:60 | 1.56 | $10^6$-$10^7$ |

The above results again clearly show that the performance of OTFT device 2 with polymer semiconductor (I) fabricated with polyethylene wax was superior in performance over the corresponding control device 1 without polyethylene wax.

INDUSTRIAL APPLICATION

The present invention relates to a semiconductor solution or ink composition for fabricating high-performance organic thin-film transistors (OTFTs). The solution or ink comprises an organic semiconductor and a mediating polymer such as polyacrylonitrile, polystyrene, or the like in an organic solvent such as dichlorobenzene. The percentage ratio by weight of semiconductor:mediating polymer ranges from 5:95 to 95:5, and preferably from 20:80 to 80:20. The solution or ink is used to fabricate via solution coating or printing a semiconductor film, followed by drying and thermal annealing if necessary to provide a channel semiconductor for OTFT devices. The resulting OTFT devices with said channel semiconductor have afforded excellent OTFT performance characteristics, and can be utilized in fabricating electronic arrays and circuitries for application in modern and emerging microelectronics including flat-panel displays, radio-frequency identification tags, sensors and imagers, smart labels and packaging, etc.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

What we claim:

1. A solution-based method of fabricating a channel semiconductor for organic thin-film transistors at room temperature comprising:
dissolving at least one organic semiconductor and at least one hydrocarbon binder in at least one solvent to produce a solution;
coating or printing said solution on a substrate to produce a coated substrate; and
drying said coated substrate at room temperature to produce a channel semiconductor;
wherein the at least one organic semiconductor comprises a diketopyrrolopyrrole-based polymer.

2. The method according to claim 1, wherein the at least one hydrocarbon binder is selected from straight-chain aliphatic hydrocarbons or branched-chain aliphatic hydrocarbons.

3. The method according to claim 1, wherein the at least one hydrocarbon binder is an aliphatic hydrocarbon including aromatic substituents selected from phenyl and tolyl.

4. The method according to claim 1 wherein the solution further comprises other additives selected from other hydrocarbon derivatives, aromatic compounds, or polymer additives other than the at least one hydrocarbon binder.

5. The method according to claim 1 wherein the at least one hydrocarbon binder comprises paraffin wax, household candle wax, or polyethylene wax.

6. The method according to claim 1 wherein the at least one hydrocarbon binder has a melting point above room temperature.

7. The method according to claim 1 wherein the proportion of the at least one hydrocarbon binder in the channel semiconductor ranges from 10% to 90% by weight.

8. The method according to claim 7 wherein the proportion of the at least one hydrocarbon binder in the channel semiconductor ranges from 45% to 70% by weight.

9. The method according to claim 1 wherein the at least one organic semiconductor comprises a polymer represented by the following formula:

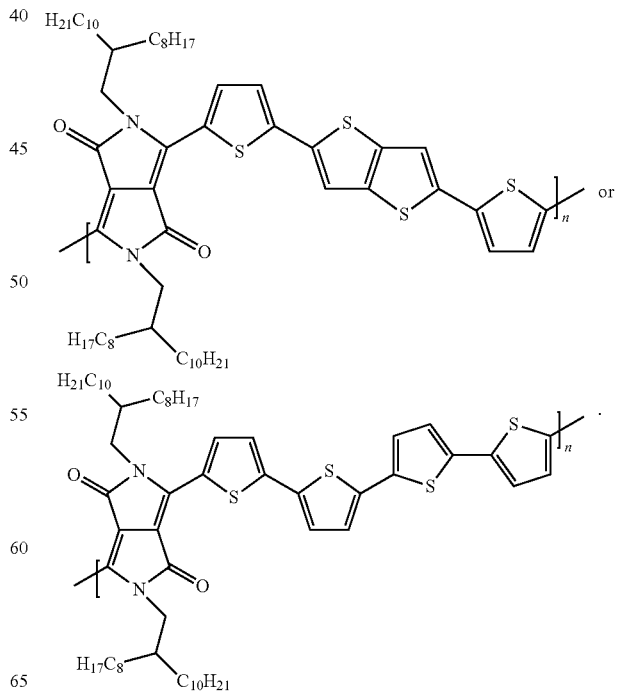

10. The method according to claim 1 wherein the at least one solvent comprises chlorobenzene or dichlorobenzene.

11. A solution-based method of fabricating a channel semiconductor for organic thin-film transistors comprising:
dissolving an organic semiconductor in a solvent with a mediating polymer or hydrocarbon binder at a percentage ratio by weight of organic semiconductor:mediating polymer ranging from 5:95 to 95:5 or a hydrocarbon binder loading from 10 to 90 weight percent to produce a solution; and
spin casting or printing said solution on a substrate to produce a channel semiconductor;
wherein the resulting organic thin-film transistor with said channel semiconductor exhibits increased field effect mobility as compared to an organic thin-film transistor with a channel semiconductor formed from a solution without a mediating polymer, and wherein the organic semiconductor comprises a diketopyrrolopyrrole-based polymer.

12. The method according to claim 11, wherein the percentage ratio by weight of organic semiconductor:mediating polymer ranges from 20:80 to 80:20.

13. The method according to claim 11, wherein the resulting organic thin-film transistor with said channel semiconductor has a field effect mobility of greater than or equal to $2\ cm^2V^{-1}s^{-1}$ and a current on/off ratio of greater than or equal to $10^5$.

14. The method according to claim 11, wherein the mediating polymer comprises polyacrylonitrile, polystyrene, poly(methyl methacrylate), poly(methyl methacrylate-alt-styrene), polyvinyl chloride, or mixtures thereof.

15. The method according to claim 11, wherein the organic semiconductor comprises a polymer represented by the following formula:

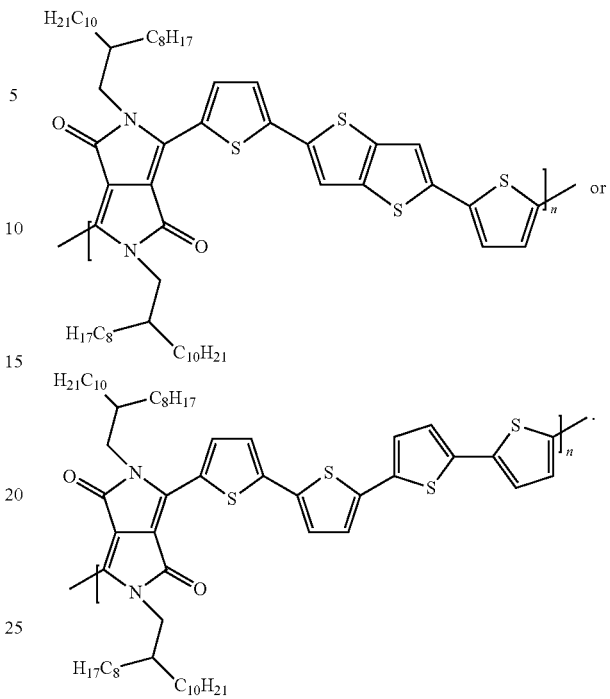

16. The method according to claim 11, further comprising drying with thermal annealing after the spin casting or printing of the solution on a substrate.

* * * * *